(12) United States Patent
Beroz et al.

(10) Patent No.: US 6,338,982 B1
(45) Date of Patent: Jan. 15, 2002

(54) ENHANCEMENTS IN FRAMED SHEET PROCESSING

(75) Inventors: Masud Beroz, Milpitas; Thomas H. DiStefano, Monte Sereno; Matthew T. Hendrickson, San Jose; David Light, Los Gatos; John W. Smith, Palo Alto, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/688,397

(22) Filed: Oct. 16, 2000

Related U.S. Application Data

(62) Division of application No. 09/173,797, filed on Oct. 16, 1998, now Pat. No. 6,217,972.
(60) Provisional application No. 60/061,932, filed on Oct. 17, 1997.

(51) Int. Cl.[7] .......................... H01L 21/02; H01L 44/00; B32B 1/04
(52) U.S. Cl. .................. 438/116; 438/118; 269/909
(58) Field of Search ................. 438/116, 118; 269/909

(56) References Cited

U.S. PATENT DOCUMENTS

| | | | |
|---|---|---|---|
| 3,537,169 A | 11/1970 | Eigeman et al. ............ 437/226 |
| 3,562,058 A | 2/1971 | Boyd ........................ 438/464 |
| 3,657,805 A | 4/1972 | Johnson ...................... 29/589 |
| 3,755,048 A | 8/1973 | Schubert ..................... 29/203 |
| 3,762,032 A | 10/1973 | Bowling et al. ............. 29/493 |
| 3,766,638 A | 10/1973 | Moore ........................ 29/583 |
| 4,037,111 A | 7/1977 | Coquin et al. .............. 250/505 |
| 5,055,907 A | 10/1991 | Jacobs ........................ 357/71 |
| 5,148,266 A | 9/1992 | Khandros et al. ............ 357/80 |
| 5,169,804 A | 12/1992 | Schwartzbauer ........... 437/209 |
| 5,238,876 A | 8/1993 | Takeuchi et al. ........... 437/226 |
| 5,280,894 A | 1/1994 | Witcraft et al. ............. 269/287 |
| 5,282,312 A | 2/1994 | DiStefano et al. ............ 29/830 |
| 5,288,663 A | 2/1994 | Ueki .......................... 437/250 |
| 5,336,649 A | 8/1994 | Kinsman et al. ............ 437/209 |
| 5,362,681 A | 11/1994 | Roberts, Jr. et al. ........ 437/226 |
| 5,518,964 A | 5/1996 | DiStefano et al. .......... 437/209 |
| 5,548,091 A | 8/1996 | DiStefano et al. .......... 174/260 |
| 5,559,915 A * | 9/1996 | Deveau |
| 5,578,167 A | 11/1996 | Sooriakumar et al. ... 156/654.1 |
| 5,605,844 A | 2/1997 | Oki et al. ...................... 437/8 |
| 5,622,900 A | 4/1997 | Smith ......................... 438/464 |
| 5,654,204 A | 8/1997 | Anderson ..................... 438/15 |
| 5,776,796 A | 7/1998 | DiStefano et al. .......... 438/106 |

(List continued on next page.)

FOREIGN PATENT DOCUMENTS

| | | |
|---|---|---|
| DE | 39 19 564 A1 | 1/1991 |
| WO | WO/94/03036 | 2/1994 |
| WO | WO 96/02068 | 1/1996 |
| WO | WO 97/11486 | 3/1997 |

*Primary Examiner*—Deborah Jones
*Assistant Examiner*—Jason Savage
(74) *Attorney, Agent, or Firm*—Lerner, David, Littenberg, Krumholz & Mentlik, LLP

(57) ABSTRACT

A flexible sheet used in manufacture of microelectronic components is held on a frame formed from a rigid material so that the frame maintains the sheet under tension during processing and thereby stabilizes the dimensions of the sheet. The frame may be formed from a rigid, light-transmissive material such as a glass, and the bond between the frame and sheet may be made or released by light transmitted through the frame. Preferred features of the framed sheet minimize entrapment of processing liquids such as etch solutions, thereby minimizing carryover of processing solutions between steps. The frame may have contact openings which permit engagement of a metallic layer on the sheet by an electrode carrying electroplating or etching current without disturbing the main portion of the sheet where features are to be formed or treated.

9 Claims, 12 Drawing Sheets

U.S. PATENT DOCUMENTS

| | | |
|---|---|---|
| 5,798,286 A | 8/1998 | Faraci et al. ................. 439/113 |
| 5,801,441 A | 9/1998 | DiStefano et al. .......... 257/696 |
| 5,830,782 A | 11/1998 | Smith et al. ................. 438/123 |
| 5,866,952 A | 2/1999 | Wojnarowski et al. ...... 257/788 |
| 5,875,545 A | 3/1999 | DiStefano et al. ............ 29/840 |
| 5,913,109 A | 6/1999 | DiStefano et al. .......... 438/117 |
| 5,961,762 A * | 10/1999 | Zelinka et al. |
| 6,064,221 A | 5/2000 | Moden et al. .............. 324/765 |
| 6,171,163 B1 * | 1/2001 | Seko et al. |
| 6,228,685 B1 * | 5/2001 | Beroz et al. |
| 6,264,773 B1 * | 7/2001 | Cerio |

* cited by examiner

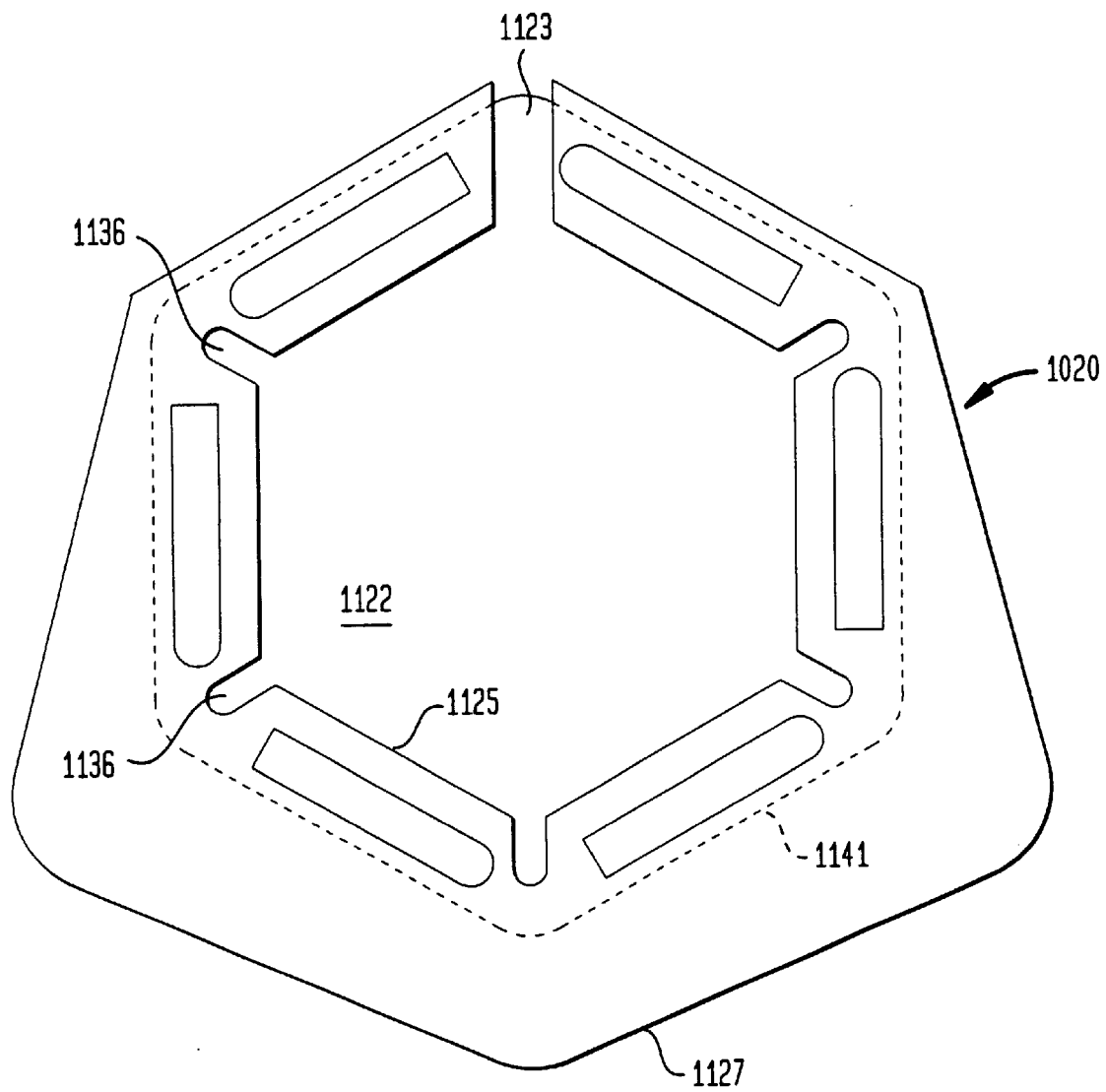

ENHANCEMENTS IN FRAMED SHEET PROCESSING

CROSS-REFERENCE TO RELATED APPLICATIONS

The present application is a divisional of U.S. application Ser. No. 09/173,797 filed Oct. 16, 1998 now U.S. Pat. No. 6,217,972, which in turn claims the benefit of United States Provisional Patent Application 60/061,932, files Oct. 17, 1997, the disclosures of which are hereby incorporated by reference herein.

BACKGROUND OF THE INVENTION

The following copending, commonly assigned United States Patent Applications contain disclosure pertinent to the present inventions: Ser. No. 09/138,858, filed Aug. 24, 1998; Ser. No. 08/440,665 filed May 15, 1995, now U.S. Pat. No. 5,801,441; Ser. No. 08/271,768, filed on Jul. 7, 1994, now U.S. Pat. No. 5,518,964; Ser. No. 09/095,251, filed Jun. 10, 1998; Ser. No. 08/532,528 filed Sep. 22, 1995, now U.S. Pat. No. 5,798,286; and Ser. No. 08/690,532 filed Jul. 31, 1996. The disclosures of said applications and patents are incorporated by reference herein. The disclosure of U.S. Pat. No. 5,148,266 is also incorporated by reference herein.

A copending, commonly assigned United States Patent Application entitled Framed Sheet Processing, which application claims benefit of said United States Provisional Patent Application 60/061,932 is being filed of even date herewith. Said application filed of even date herewith is hereby incorporated by reference herein.

The present invention relates to fabrication of microelectronic circuit components, interconnections and packages, and to articles useful in such processes.

Many microelectronic assemblies employ panel-like circuit elements. For example, one common method of connecting the contacts on a semiconductor chip to external circuitry, referred to as tape automated bonding or "TAB" uses a sheet-like tape including a flexible dielectric layer, typically polyimide with metallic circuit traces thereon. Ordinarily, these circuit traces are formed by photochemical processes such as etching or plating using photographically patterned resists. The precision with which such a circuit can be formed is limited by the dimensional stability of the dielectric layer during processing. This problem increases as the size of the circuit increases. Typical TAB tape has numerous individual circuits made by photographically patterning an area of the flexible circuit of the size required to mount a single chip. The individual circuits are spaced along the length of the chip. Because the process only requires registration of features over a relatively small region corresponding to the dimensions of an individual chip, there is no need to maintain precise spacing between widely separated features. Moreover, typical TAB tapes do not require especially precise registration between features formed in different stages of the manufacturing process.

Larger circuits which require precise relative location of widely-spaced features have been fabricated heretofore using a "decal" or "applique" approach in which the flexible circuit is fabricated on the surface of a metallic plate. The metallic plate is then removed, as by exposure to a caustic etching process. For example, certain embodiments of U.S. Pat. No. 5,055,907 disclose manufacture of a large circuit on the surface of an aluminum plate. After fabrication of the circuit, and after microelectronic elements such as individual semiconductor chips are mounted to the circuit, a support ring is attached around the periphery of the circuit and the plate is removed. In this arrangement, the plate maintains dimensional stability of the circuit throughout the fabrication and mounting process. However, the additional process steps required to remove the plate considerably complicate use of this approach. Also, the plate precludes access to one side of the circuit which impedes the fabrication process and restricts the design of the finished product.

The aforementioned U.S. Pat. No. 5,518,964 and the corresponding PCT International Publication WO 96/02068, the disclosure of which is also hereby incorporated by reference herein, disclose processes in which circuit elements such as microelectronic connection components are fabricated in the form of a wafer-size sheet. In certain processes disclosed in the '964 patent, a sheet of a starting material such as a flexible dielectric sheet with metallic layers thereon is stretched and bonded to a rigid frame having an opening or aperture therein so that the sheet is held taut by the rigid frame and maintained under tension by the frame. The frame may be in the form of a ring. The ring may be formed from a material such as molybdenum, which has a coefficient of thermal expansion close to that of a silicon semiconductor wafer, and lower than the coefficient of expansion of the sheet. The sheet may be stretched and attached as by bonding to the ring at an elevated temperature, so that the sheet remains in tension during processing at lower temperatures. While the sheet is held in the ring, it is accessible from both sides. The sheet is treated using various circuit-fabrication techniques such as etching and plating using photographically patterned resists. Because the sheet is maintained under tension throughout the process, it remains dimensionally stable. Because the sheet is accessible from both sides, fabrication of the sheet, and mounting of the sheet to the wafer can be performed readily. The features formed on the sheet are precisely positioned relative to one another over the entire extent of the sheet.

After processing, the entire sheet, with the rings still attached, can be aligned with a large assemblage of semiconductor chips such as a unitary semiconductor wafer. Leads formed during the fabrication process can be connected to all of the chips on the wafer. After connection, and after other processes such as deformation of leads on the sheet and injection of curable compliant material, the individual chips and associated portions of the sheet can be severed to provide individual packaged chips or subassemblies, each including one or more chips and an associated part of the sheet. Thus, the basic approach of using a rigid frame around the periphery of a sheet to provide dimensional stability during fabrication, as set forth in the '964 patent, allows fabrication of microelectronic circuit elements in large array, such as wafer-size arrays with excellent dimensional stability and control. Further improvements in this basic approach are taught in the aforementioned commonly assigned U.S. patent application Ser. No. 08/690,532 filed Jul. 31, 1996, entitled Fixtures And Methods Of Lead Bonding and Deformation. In certain preferred embodiments taught in the '532 application, the sheet may be stretched by initially attaching it to a ring formed from a material of relatively high coefficient of thermal expansion such as aluminum at a low temperature such as room temperature, then heating the sheet and high-expansion ring and then attaching the sheet to a lower expansion ring such a molybdenum ring. As disclosed, for example, in said U.S. Pat. No. 5,798,286 and in the corresponding PCT International Publication WO 97/11486, the disclosure of which is also hereby incorporated by reference herein, a frame-stretched sheet can be used in other assembly processes using individual semiconductor chips mounted individually to the sheet or mounted on a platen in a preselected array and bonded to the sheet as a unit.

Framed sheets have also been employed in unrelated arts and for different purposes. For example, thin framed sheets referred to as pellicles used in the optical arts as optical beam splitters as shown, for example, in Edmund Scientific, 1997 Optics and Optical Instruments Catalog, p. 56. U.S. Pat. No. 4,037,111 discloses the use of a mechanically stretched sheet held taut by a borosilicate glass frame as a mask for X-ray lithography. German Offenlegungssachrift DE-3,919,564 A1 discloses fabrication of printed circuits by silk-screening onto a polyimide film held taut by an aluminum frame.

U.S. Pat. Nos. 3,537,169; 5,288,663; 5,169,804; 5,654,204; 3,562,058 and 5,362,681 teach processes in which a wafer is adhered to a plastic film or "dicing tape," then sawn into individual chips, whereupon the resulting chips are released from the film. In certain processes described in these patents, the film is carried by a frame.

U.S. Pat. No. 5,622,900 discloses a method in which a wafer is sawn into individual chips prior to completion of fabrication steps. Before sawing, the back side of the wafer is bonded to a "dicing tape" held on an opaque, aluminum ring. A UV-transparent "substrate wafer" is bonded to the side of the tape opposite from the wafer to be processed. The substrate wafer holds the individual chips in position after sawing. After processing is complete, the assembly is exposed to ultraviolet light through the transparent substrate wafer.

U.S. Pat. No. 5,605,844 discloses a system in which a dicing sheet or film is bonded to a ring of unspecified composition and a wafer is bond to the dicing sheet and sawn into individual chips. After dicing, while the individual chips are still retained on the dicing sheet, the chips are engaged with a tester or "contactor" so that features on the contactor engage features of the chips and/or engage in the kerfs between chips left by the sawing operation. The engaged contactor and chips are then subjected to a burn-in operation at an elevated temperature. As the temperature of the assembly changes, the chips move with the features of the contact and the sheet stretches to accommodate such movement.

Despite all of these improvements and efforts in the art, still further improvements would be desirable.

SUMMARY OF THE INVENTION

The present invention addresses these needs.

One aspect of the present invention provides a framed sheet for use in manufacturing a microelectronic component. The framed sheet in accordance with this aspect of the invention includes a flexible sheet having oppositely facing exterior surfaces and a frame having a structure defining an aperture. The structure of the frame includes a light-transmissive portion. The flexible sheet is bonded to the light-transmissive portion of the frame so that the sheet extends across the aperture and so that the frame holds the sheet taut, in tension. The bond between the sheet and the light-transmissive portion of the frame is susceptible to degradation by exposure to light in a degradation wavelength band, and the light-transmissive portion of the frame is adapted to transmit light in such a degradation wavelength band. Thus, the bond between the sheet and the light-transmissive portion of the frame can be released by applying light in the degradation wavelength band to the bond through the light-transmissive portion of the frame. Most preferably, the flexible sheet includes a dielectric layer and at least one, and typically two, metallic layers overlying the dielectric layer at the exterior surfaces. As is further discussed below, the metallic layers can be used to form parts of conductive elements such as leads in the finished component and also serve to stabilize the mechanical properties of the sheet. However, the metallic layers make it impossible to apply degradation light to the bond between the sheet and frame through the flexible sheet. The transparent frame allows application of the degradation light to the bond and thus quickly facilitates removal of the sheet from the frame and reclamation of the frame for reuse. Most preferably, at least the light-transmissive portion of the frame, and preferably the entire frame structure, is formed from a transparent inorganic material. The light-transmissive portion of the frame desirably is formed from a material selected from the group consisting of quartz, fused silica and glasses such as soda lime glass, borosilicate glasses and aluminosilicate glasses. These materials transmit light and also have coefficients of thermal expansion substantially lower than the coefficients of thermal expansion of the materials used for the flexible sheet. This facilitates tensioning of the sheet; provided that the sheet is bonded to the frame at a temperature of above the temperatures encountered in processing, differential thermal contraction of the sheet and frame will tend to maintain tension in the sheet. For certain applications, the frame structure may have a coefficient of thermal expansion approximately equal to the coefficient of thermal expansion of silicon, which facilitates registration of features on the sheet with features on a silicon wafer. Moreover, the most preferred materials have very high elastic module, so that the frame has substantial stiffness even if the structure of the frame is relatively thin. As further discussed below, this facilitates processing operations, such as those which require exposure of the framed sheet to treatment liquids and subsequent removal of the treatment liquids from the framed sheet. The preferred transparent materials, and the use of these transparent materials in conjunction with a light-degradable bond provides a unique combination of benefits.

A related aspect of the present invention provides methods of processing a framed sheet to form microelectronic components. Methods according to this aspect of the invention include the steps of providing a framed sheet including a frame having an aperture and a light-transmissive portion and a flexible sheet extending across the aperture and bonded to the light-transmissive portion of the frame; performing one or more operations on the flexible sheet and then releasing the bond between the sheet and the frame by directing light in a degradation wavelength band through the transmissive portion of the frame through the bond. The operations performed on the sheet may include treatment or formation of features such as conductive leads, vias or other conductive elements to be incorporated in the finished component; formation of features in the dielectric layer which will be included in the finished component such as formation of bonding holes and/or formation of holes for vias and like; and/or engaging features on the sheet with other parts, such as with semiconductor chips, a semiconductor wafer or other parts of the finished microelectronic component. As further discussed below, the tension in the sheet greatly enhances the dimensional stability of the sheet and greatly reduces unpredictable variations in locations of features on the sheet. This facilitates registration of features on the sheet with external elements such as processing equipment or other parts.

In a further aspect of the present invention, the sheet is bonded to the frame using an adhesive activated by light transmitted through the frame. Thus, a method according to this aspect of the present invention includes the steps of providing a frame having an aperture and having a light-transmissive portion adjacent the aperture; temporarily holding a flexible sheet so that the sheet extends across the aperture and overlies the light-transmissive portion of the frame; and providing an adhesive at the interface between the sheet and the light transmissive portion of the frame so that the adhesive contacts the frame and the sheet. During the temporary holding step, the sheet is bonded to the frame by directing light in a curing wavelength band through the light-transmissive portion of the frame so as to cure the adhesive. Most preferably, the temporary holding step includes the step of holding the flexible sheet taut. Typically, the curing wavelength band is in the ultraviolet band. The curing wavelength band may be the same as, or different from, the degradation wavelength band discussed above. In a process which combines aspects of the invention, the sheet may be bonded to the frame using curing light and debonded from the frame using degradation light.

Most preferably, the bonding step is performed while the sheet and the frame are at a temperature or temperatures different from the temperature to be used in processing, and most preferably at an elevated temperature, above the temperatures to be used in processing of the framed sheet, so that differential thermal expansion or contraction occurring between the bonding temperature and the processing temperature make the tension in the sheet at the processing temperature higher than the tension at the bonding temperature.

A further aspect of the invention provides framed sheets for use in manufacturing microelectronic components. The framed sheet includes a frame with a structure defining an aperture. The framed sheet further includes a flexible sheet having oppositely facing exterior surfaces and a first metallic layer at a first such exterior surface. Here again, the sheet extends across the aperture in the frame. The first exterior surface of the flexible sheet is bonded to the structure so that the frame holds the sheet taut. The frame further has at least one contact opening extending through the structure. The sheet includes a contact region aligned with the contact opening, so that the first metallic layer is exposed at the contact opening for engagement with an electrical contact during processing. The bond between the sheet and the structure includes an inner bond region extending outwardly from the aperture of the frame in the vicinity of the contact openings. The inner bond region mechanically isolates the contact region of the sheet from the portion of the sheet which extends across the aperture. Thus, an electrical contact can be engaged with the metallic layer for purposes such as electroplating or electrochemical etching during processing of the framed sheet without disturbing that portion of the framed sheet which is disposed within the aperture. The structure of the frame desirably is formed at least partially from a dielectric material, and most preferably is formed from an inorganic material as discussed above. The aperture may have a polygonal shape such as a rectangle and each contact opening desirably is disposed adjacent a corner of the polygon.

Yet another aspect of the invention provides a framed sheet, again including a frame having a structure defining an aperture and a flexible sheet with oppositely facing exterior surfaces secured to the structure so that the sheet extends across the aperture and the structure holds the sheet taut. According to this aspect of the invention, the flexible sheet includes a dielectric layer and at least one metal layer on at least one surface of the sheet. The at least one metal layer most preferably includes one or more metallic elements having a substantially uniform, distribution of metal within edge regions of the sheet adjacent the edges of the aperture and hence adjacent the structure of the frame. These edge metal regions may include, for example, a continuous layer of metal or a uniform pattern of discrete metallic features. These uniform metallic regions provide uniform structural properties in the edge regions and further promote dimensional stability and predictability in dimensional changes occurring during processing.

According to a further aspect of the invention, a framed sheet may include a frame and a taut sheet in which the metal layer includes a grid of metallic strips defining a plurality of open areas therebetween and extending through a middle portion of the sheet remote from the edges and the structure. In this instance, the metallic strips provide enhanced dimensional stability in the middle regions of the sheet.

A further aspect of the invention provides framed sheets which are particularly well suited to processes involving treatment fluids such as liquids used in electroplating, etching, cleaning and the like. Here again, the framed sheet includes a flexible sheet and a frame having a structure defining an aperture. The structure has a mounting surface with inner edges bounding the aperture and outer edges remote from the aperture. The flexible sheet is bonded to the mounting surface so that the frame holds the sheet taut and so that the sheet extends across the aperture. The sheet desirably is sealed to the mounting surface over substantially the entirety of the edges of the mounting surface, so that processing fluids cannot become lodged between the sheet and the mounting surface. This reduces carryover of processing fluids from one process step to the next, thereby reducing contamination in later stages. Desirably, the sheet is sealed to the mounting surface over essentially the entire mounting surface so that there are essentially no gaps between the surface of the sheet and the mounting surface of the structure.

According to a further aspect of the invention, a framed sheet includes a flexible sheet and a frame including a structure defining an aperture, the structure having a mounting surface facing in a forward direction with an inner edge bounding the aperture. The structure also has an inner edge surface intersecting the mounting surface at the inner edge of the structure and extending in rearward direction away from the mounting surface. Here again, the flexible sheet is bonded to the mounting surface of the structure so that the frame holds the sheet taut and so that a first exterior surface of the sheet overlies the mounting surface of the structure, the sheet being sealed to the mounting surface at least along the inner edge of the mounting surface. Framed sheets, according to this aspect of the invention, most preferably include a fillet joining the first exterior surface of the sheet and the inner edge surface of the frame structure. For example, the fillet may be formed by an adhesive which also bonds the sheet to the structure. The fillet facilitates drainage of processing fluids away from the corner formed by the sheet and the inner edge surface of the structure, thus further reducing carryover of processing fluids. Most preferably, the frame has a rear surface extending generally parallel to the mounting surface, and the rear surface is about 10 mm or less from the mounting surface. For example, the frame may have a uniform thickness of about 10 mm or less. The use of such a thin frame further reduces processing fluid entrapment and carryover. Framed sheets according to the foregoing aspects of the invention may be processed in a method which includes the step of immersing or otherwise exposing the framed sheet to a first treating liquid, removing the article from the first treating liquid and draining the first treating liquid from the framed sheet.

A framed sheet according to a further aspect of the invention also includes a frame assembly with a structure defining an aperture and a flexible sheet secured to the structure and extending across the aperture. The structure of the frame assembly has a neutral plane in bending. The structure holds the sheet in tension, with the sheet being disposed adjacent the neutral plane of the frame assembly. For example, the frame assembly may include a pair of frames disposed on opposite surfaces of the sheet so that the neutral plane of the two frames taken together is coincident with the plane of the sheet. Alternatively, the frame assembly may include a single frame having portions extending on both sides of the sheet. Such a frame may include, for example, a main portion having a mounting surface and a rim portion projecting from such mounting surface so that when the sheet is mounted to the mounting surface, the rim portion is disposed on one side of the sheet whereas the main portion is disposed on the other side of the sheet. Use of a frame assembly with its neutral plane adjacent to the plane of the sheet minimizes any tendency of the frame to bow out of plane due to the forces applied to the frame by the sheet. This further enhances dimensional stability of the sheet.

Yet another aspect of the invention provides methods of bonding a sheet to a frame. In a method according to this aspect of the invention, a flexible sheet is held in engagement with a fixture so that the sheet overlies a top surface of the fixture, with a portion of the sheet overlying a loop-like groove in such top surface. Preferably, the sheet is held to the fixture along a line of engagement outside of the groove. A first surface of the sheet faces away from the top surface of the fixture whereas the second surface of the sheet faces toward the top surface of the fixture. The method further includes the step of applying a differential fluid pressure between the first and second surfaces at the groove as, for example, by applying a subatmospheric pressure within the groove while the first surface remains exposed to atmospheric pressure, so that the fluid pressure on the first surface is higher than the fluid pressure in the groove on the second surface. Thus, differential fluid pressure tends to force the sheet into the groove and pulls a central portion of the sheet to a taut condition. While the central portion of the sheet is taut, a frame is engaged with the central portion of the sheet so that the sheet extends across an aperture in the frame and the frame is secured to the central portion of the sheet, whereupon the sheet is released from the fixture. Most preferably, the step of securing the structure of the frame to the sheet is performed by providing a controlled amount of adhesive at the interface between the frame and the sheet as, for example, by providing a controlled bead of adhesive on the frame or the sheet prior to assembly of these components with one another. The securing step desirably further includes the step of squeezing the frame and the sheet together with a controlled force during the bonding operation. This provides repeatable, controllable beads of adhesive at the edges of the frame so as to form fillets as discussed above.

Still further aspects of the invention provide methods of making framed sheets in which a metallic layer is applied on a surface of a flexible sheet material and in which frames having apertures are applied to the sheet material so that central regions of the sheet material are exposed through apertures in the frames so that the frames hold the sheet material taut. In methods according to this aspect of the invention, the frame-applying step is performed so that each central region of the sheet is not contacted by any solid object between the time the metal layer is applied on that central region and the time the frame is engaged to surround that central region. Thus, each central region is preserved in its smooth, unwrinkled state up to the time the frame is applied. After the frame is applied, the resulting framed sheet can be handled by engaging the frame, rather than the central region of the sheet. Still other aspects of the invention provide methods of making framed sheets including the step of forming the frame in place on the sheet.

Methods according to still further aspects of the invention use framed sheets having frames with coefficients of thermal expansion different from the coefficient of thermal expansion of the flexible sheet. Plural operations are performed on the framed sheet. The method desirably includes the step of adjusting the temperature of the framed sheet between operations so as to vary the tension of the flexible sheet. Thus, different operations are performed with the flexible sheet under different degrees of tension. For example, a hole-forming operation in which holes are formed in the sheet may be performed while the sheet is under a relatively low tension and other operations may be performed while the sheet is under a tension higher than such relatively low tension. This reduces the possibility that hole-forming operations will cause localized plastic deformation of the sheet.

These and other objects, features and advantages of the present invention will be more readily apparent from the detailed description of preferred embodiments set forth below, taken in conjunction with the accompanying drawings.

BRIEF DESCRIPTION OF THE DRAWINGS

FIG. 16 is a view similar to FIG. 15 but depicting a framed sheet in accordance with a further embodiment of the invention.

DETAILED DESCRIPTION OF THE PREFERRED EMBODIMENTS

Figure 1A:
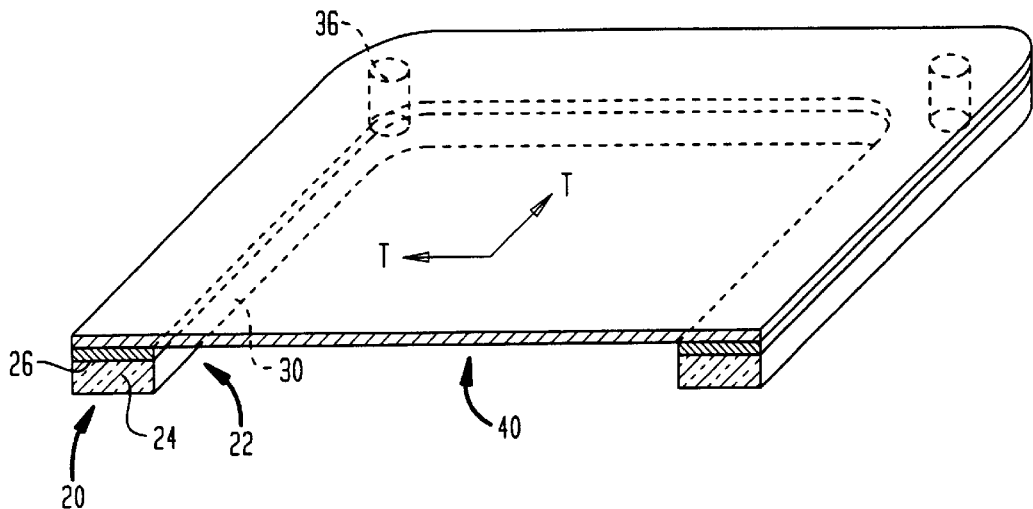
FIG. 1A is a fragmentary diagrammatic perspective view illustrating a framed sheet in accordance with one embodiment of the invention.
Figure 1B:
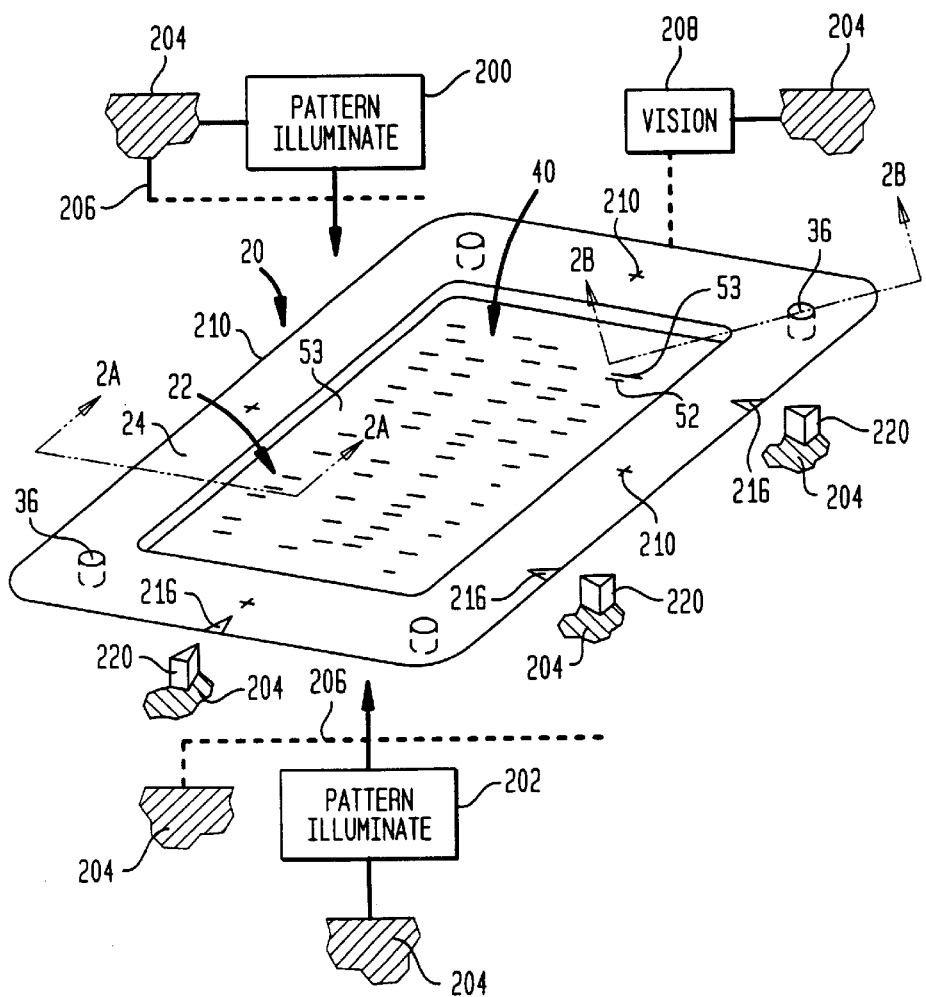
FIG. 1B is a diagrammatic perspective view illustrating the framed sheet of FIG. 1A in conjunction with processing apparatus.
Figure 2A:
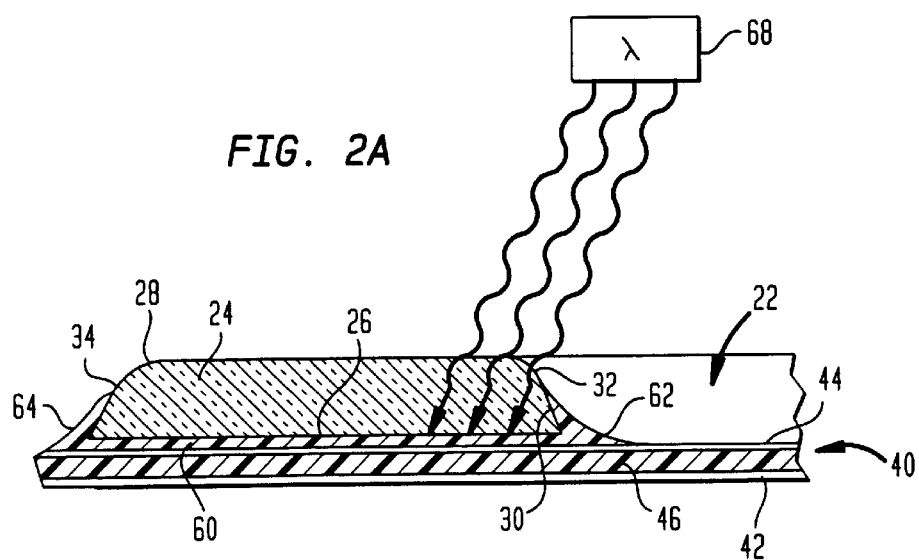
FIG. 2A is a diagrammatic sectional view on an enlarged scale taken along line 2A—2A in FIG. 1.
Figure 2B:
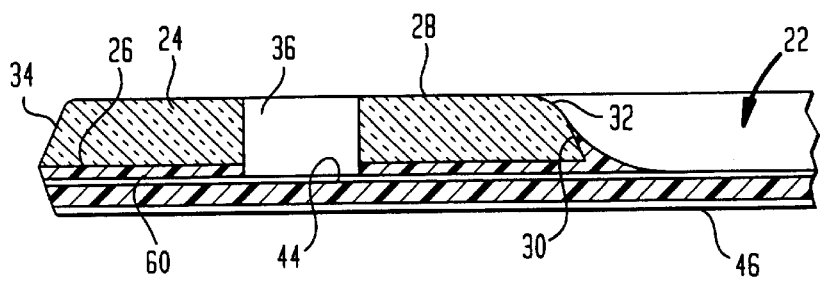
FIG. 2B is a view similar to FIG. 2A but taken along line 2B—2B in FIG. 1.

As depicted from FIGS. 1A and 1B, an article, referred to herein as a "framed sheet" in accordance with one embodiment of the invention includes a frame 20 having structure defining a central aperture 22. Central aperture 22 and the exterior of frame 20 are generally rectangular. The structure of frame 20 consists of a continuous rail 24 extending in a rectangular ring around aperture 22, so that the structure entirely surrounds the aperture and so that portions of the structure are disposed on opposite sides of the aperture. Rail 24 defines a planar mounting surface 26 facing in a forward direction (upwardly as seen in FIG. 1A and downwardly as seen in FIGS. 1A, 2A and 2B) and a rear surface 28, facing in the opposite, rearward direction. The frame rail also has an inner edge wall 30 intersecting the mounting surface 26 at an inner edge of the mounting surface. The inner edge of the intersection of walls 30 and 26 forms a boundary of aperture 22. As best seen in FIGS. 2A and 2B, the inner edge wall 30 slopes or flares outwardly, away from aperture 22 in the rearward direction, away from mounting surface 26. A radius or chamfer 32 is provided at the juncture of the inner edge surface 30 and the rear surface 28. Desirably, rail 24 is relatively thin, so that rear surface 28 is within about 10 mm of mounting surface 26, at least in the region of the rear surface adjacent aperture 22. The rear surface 28 may also be gently curved or radiused over its entire extent. An outer edge wall 34 joins rear surface 28 with mounting surface or forward surface 26. The outer edge wall may also be sloped as indicated in FIGS. 2A and 2B, and a radius may be provided at the juncture of the outer edge wall and the rear surface 28 of the rail.

Rail 24 has contact openings 36 extending through it, from its rear surface to its forward or mounting surface 26, at spaced apart locations around the periphery of aperture 24 and most preferably, at the corners of the frame as illustrated in FIG. 1. The frame structure or rail 24 is formed from a material which transmits light at least in preselected wavelength bands as discussed below. As used in this disclosure, the term "light" includes infrared ultraviolet radiation and other nonvisible radiation, as well as visible light.

The article depicted in FIG. 1 further includes a flexible sheet 40 secured to the mounting surface 26 of the frame around all sides of aperture 22, so that the flexible sheet extends across the aperture. As further discussed below, sheet 40 is maintained under uniform tension and hence maintained taut by the frame. Sheet 40 includes a flexible dielectric layer 42 such as a layer of a polyimide, typically about 20–100 microns thick and more typically, about 25–75 microns thick. Flexible sheet 40 further includes a first metallic layer 44 on a first surface of the sheet and a second metallic layer 46 on the second, opposite surface of the sheet. At the particular stage of processing illustrated in FIG. 1, first layer 40 has already been patterned to provide features such as terminals, leads and other features 53 used in making connections to microelectronic elements and used as conductive elements of circuitry in the finished products made from the sheet. These features also have been fabricated during processing steps prior to the step depicted in FIG. 1. Typically, the article is initially formed with continuous metal layers on the flexible sheet which are subtractively etched during processing to form the features shown. Alternatively or additionally, metal features can be formed by additive processes. The second metal layer 46 desirably has similar features.

As best seen in FIG. 2A, sheet 40 is bonded to mounting surface 26, and hence secured to the frame 20 by a layer of adhesive 60 between the first surface 44 of the sheet and mounting surface 26. The thickness of adhesive layer 60 is greatly exaggerated in FIGS. 2A and 2B for clarity of illustration. In actual practice, the adhesive layer desirably has the minimum thickness required to provide a coherent, substantially continuous adhesive layer covering the mounting surface. This tends to minimize the effects of elasticity or creep in the adhesive layer on the tension of the sheet. Adhesive layer 60 extends inwardly beyond the inner edge wall 32 and forms a fillet 62 extending from the first metallic layer 44 on the first surface of the sheet to the inner edge wall. A similar fillet 64 is provided at outer edge wall 34. Adhesive layer 60 seals the sheet to the mounting surface over the entirety of the inner and outer edges of the mounting surface and, preferably, over the entirety of the mounting surface except at contact openings 36 so that fluids cannot penetrate between the sheet and the mounting surface.

Adhesive 60 desirably is adapted to cure upon exposure to light in a predetermined curing wavelength band. Most preferably, adhesive 60 is an ultraviolet-curable adhesive. Among the UV-curable adhesives which can be employed are those sold under the trade designations Loctite 363 and Loctite 352. The adhesive should also be adapted to withstand the temperatures used in processing of the framed sheet, typically up to about 110–200° C., and up to 250–350° C. in those cases where high-temperature bonding techniques, such as gold-tin bonding are employed. The adhesive desirably should be adapted to degrade upon exposure to light in a predetermined degradation wavelength band, so as to allow removal of the sheet from the frame by exposure to such light. The curing light, degradation light or both may be applied by a YAG laser. The degradation wavelength band may be identical to the curing wavelength band. Thus, the adhesive may be curable by exposure to curing light of one intensity and may be degradable by exposure to light at a far higher intensity as, for example, light from a focused high-intensity excimer laser. Rail 24 is transmissive to light in the curing band and to light in the degradation wavelength band. As used herein, the term "light transmissive" includes both translucent and transparent. Preferred materials for forming rail 24 include vitreous materials such as borosilicate glass, soda lime glass, quartz, fused silica ($SiO_2$) and aluminosilicate glass. Light-transmissive polymers such as polycarbonates may also be employed, provided that the temperatures to which the framed sheet will be exposed are low enough that the polymer does not deform or degrade in use. In other embodiments of the invention, light-sensitive adhesive 60 may be replaced by an adhesive which cures in response to heat or which cures upon mixing of multiple ingredients as, for example, a high-temperature epoxy or urethane adhesive. In this case, the frame structure need not be light transmissive. Suitable nonlight-transmissive frame structure materials include silicon; opaque vitreous and crystalline materials such as opaque glass materials; metals such as molybdenum, Invar, Kovar, stainless steel and aluminum; and polymeric materials including reinforced polymers such as glass-reinforced and carbon-fiber reinforced liquid crystal polymers, glass-reinforced epoxies and other known polymeric materials suitable for exposure to the temperatures to be employed in processing of the framed sheet. The frame materials may be provided with surface coatings. For example, a metallic frame material such as stainless steel or aluminum may have an anodic coating or a dielectric coating such as an electrophoretically deposited dielectric.

Desirably, the material of the frame has a linear coefficient of thermal expansion different from that of sheet 40 and, preferably, lower than the linear coefficient of thermal expansion of the sheet. Typically, the coefficient of thermal expansion of sheet 40 is close to that of metallic layer 44 and hence close to the coefficient of thermal expansion of copper, i.e., about $17 \times 10^{-6}$ cm/cm-° C. Where the framed sheet is to be assembled to a silicon wafer as discussed further below, the coefficient of thermal expansion of the frame desirably is close to the coefficient of thermal expansion of silicon which is about $3 \times 10^{-6}$ cm/cm-° C. For example, the coefficient of thermal expansion of the frame desirably is about 0 to about $5 \times 10^{-6}$ cm/cm-° C. A particularly preferred material is quartz, having a coefficient of thermal expansion of about $0.5 \times 10^{-6}$ cm/cm-° C.

Adhesive layer 60 can be cured by applying curing light from a curing light source 68 (FIG. 2A) through frame structure 24, as by directing light from the curing light source onto the rear surface 28 of the frame. As further discussed below, the adhesive bond desirably is formed while the sheet is held taut. After processing of the framed sheet, and in some cases assembly of the frame sheet to semiconductor components such as assembly to a wafer, the sheet can be released from the frame by directing high-intensity degradation light through the frame structure, as by directing an excimer or YAG laser beam onto rear surface 28 and sweeping or scanning the laser beam over the extent of the frame. This procedure degrades the material of the adhesive layer in direct contact with the mounting surface 28 and hence allows removal of the adhesive layer as a whole from the mounting surface. Stated another way, it is not necessary to degrade the entire bulk of the adhesive. Upon degradation of the adhesive at the mounting surface, the sheet and adhesive layer can be peeled away from the frame, leaving the frame free for reuse and assembly to a subsequent sheet.

As best seen in FIG. 2B, holes 36 extend to the metallic layer 44 on the first surface of the sheet. The sheet remains bonded to mounting surface 26 along an inner perimeter region, between each hole 36 and the aperture 22 and also remains bonded to the mounting surface along an outer perimeter region between each mounting hole 36 and the outer edge of the frame at surface 34. Thus, the sheet remains securely mounted to the frame and the adhesive layer 60 seals the bond against infiltration of fluids at hole 36. However, the first surface and the metallic layer 44 thereon are exposed for engagement by electrical contacts inserted into hole 36. Also, because the sheet is securely held to the frame, a contact can be forcibly applied to the first surface of the sheet at the hole. Contacts also can be applied to the second surface or metallic layer 46 in a region of the sheet remote from aperture 22. The bond between the sheet and the frame, and particularly that portion of the bond extending inwardly from the contact openings to aperture 22, mechanically isolates the region of the sheet aligned with the contact openings from the region of the sheet disposed in the aperture. Because the contacts can be applied to both surfaces remote from aperture 22, engagement with the contacts does not disturb or distort that portion of the sheet within aperture 22. This aids in maintaining dimensional stability of the region of the sheet within the aperture.

A method of stretching and bonding a sheet to a frame is schematically depicted in FIGS. 3A–3D. Fixture 100 used in the process includes a plate 102 with an upper surface 104 having a groove 106 enclosing a central region 108 of the fixture. A recess 110 is provided in central region 108, leaving a ridge 112 between the groove and the recess. The shape of the groove and central region is determined by the shape of the frame. Thus, when the frame to be bonded is circular, groove 106, central region 108 and ridge 112 desirably are circular. Where the frame is rectangular, the groove and central region may also be rectangular. The fixture further includes a clamping device schematically indicated in FIG. 3B. The clamping device is arranged to clamp a sheet to the top surface 104 of the fixture along a line of engagement 116 encircling groove 106. The clamping device may include a ring extending over top surface 104 in alignment with the line of engagement 116 and may also include appropriate mechanical, pneumatic, electrical devices (not shown) for forcibly moving the ring towards the upper surface to thereby clamp a sheet between the ring and the upper surface. In the arrangement of FIGS. 3A–3D, the clamping device includes a slot 117 formed in the upper surface of the fixture in alignment with the line of engagement and a vacuum pump 119 or other device for applying subatmospheric pressure in the slot. Essentially any other device which is capable of securing the film to the top surface along the line of engagement may also be employed. Fixture 100 further includes a port 118 communicating with recess 110.

Figure 3A:
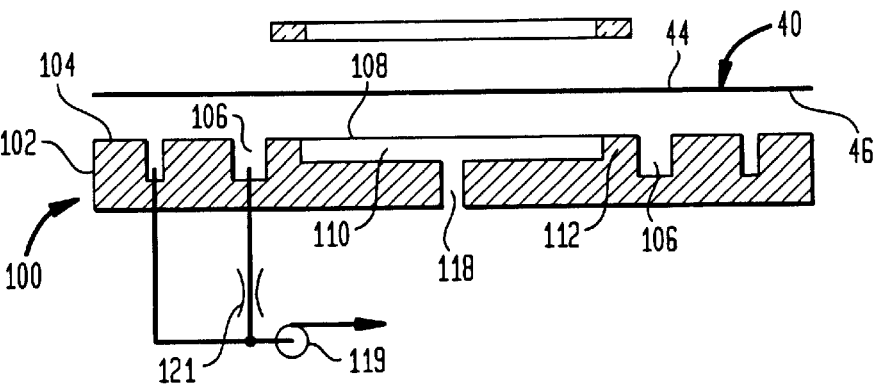
FIGS. 3A through 3D inclusive are a series of diagrammatic sectional views depicting process steps and apparatus in accordance with an embodiment of the invention used to fabricate a framed sheet.
Figure 3B:
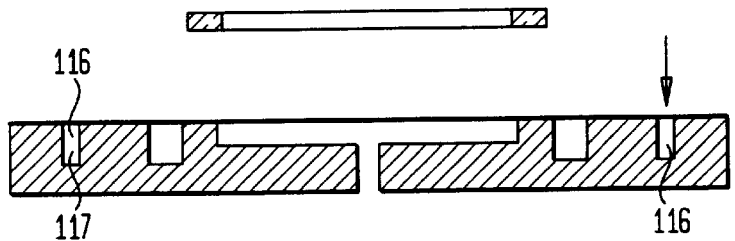
Figure 3C:
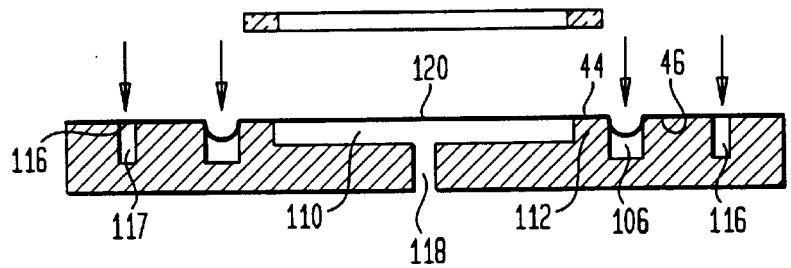
Figure 3D:
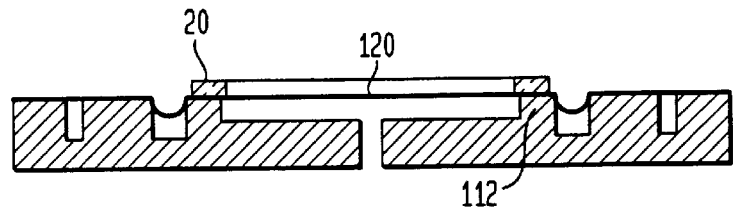

In a processing method according to a further aspect of the invention, a film or flexible sheet 40 as discussed above is temporarily held in engagement with the top surface of fixture 100 along the line of engagement 116 by vacuum applied in slot 117 by pump 119 so that a first surface of the film faces away from the groove and a second surface 46 faces towards the groove. At this stage of the process, the film and fixture are engaged with one another as depicted in FIG. 3B. Fixture 100 is maintained at an elevated temperature during this stage of the process, and hence sheet 40 tends to grow. The engagement at line of engagement 116 is maintained, and a differential fluid pressure is applied to the sheet, in the region aligned with groove 106, such that the pressure on first surface 44 is greater than the pressure on second surface 46. Preferably, the differential fluid pressure is created by applying a subatmospheric pressure or partial vacuum within groove 106, using pump 119. This forces the sheet into the groove, thereby taking up any slack in the sheet caused by the elevated temperature and stretching a central portion 120 of the sheet in alignment with the central region 108 of the fixture. As indicated in FIG. 3A, both slot 117 and groove 106 may be connected to the same vacuum pump 119, but a restrictive bleed orifice or other flow-restricting device 121 may be connected between groove 106 and the vacuum pump. This assures that the pressure in slot 117 will tend to fall more rapidly than the pressure within groove 106, so that the sheet is engaged at line of engagement 116 before substantial tension is applied at groove 106.

In the stretching operation, only a peripheral region of the sheet, in alignment with ridge 112 contacts the fixture. The central region does not contact the fixture and hence is not marred or distorted by the fixture. Recess 110 helps to prevent contact between the central region of the sheet and the fixture. Port 118 is used to admit gas to the recess to maintain the same fluid pressure on both sides of the sheet in the central region. This assures that the central region will not be distorted or deformed by differential fluid pressure. Gas flow from recess 110 to groove 116 over the intervening ridge 112 helps to lubricate the underside of the sheet in engagement with the ridge. This aids in stretching the sheet and also helps to assure a uniform tension in all directions on the sheet.

While the central portion 120 of the sheet is maintained at elevated temperature and maintained taut by the differential pressure at slot 106, a frame 20 such as the frame discussed above is engaged with the periphery of the sheet on ridge 112 and bonded thereto by an adhesive, such as the light-curable adhesive 60 discussed above with reference to FIGS. 2A and 2B. Provided that frame 20 has a coefficient of thermal expansion lower than that of the sheet, the frame also may be at an elevated temperature during the bonding operation. Thus, when the frame and sheet are cooled after bonding, the sheet will be maintained in a taut condition, and will be further stretched, by differential thermal contraction. After the bonding operation, the sheet is released from the fixture as by releasing the clamping device on a line of engagement 116 and releasing the differential pressure at groove 106. That portion of the sheet outside of the frame may be trimmed away.

Figure 3E:
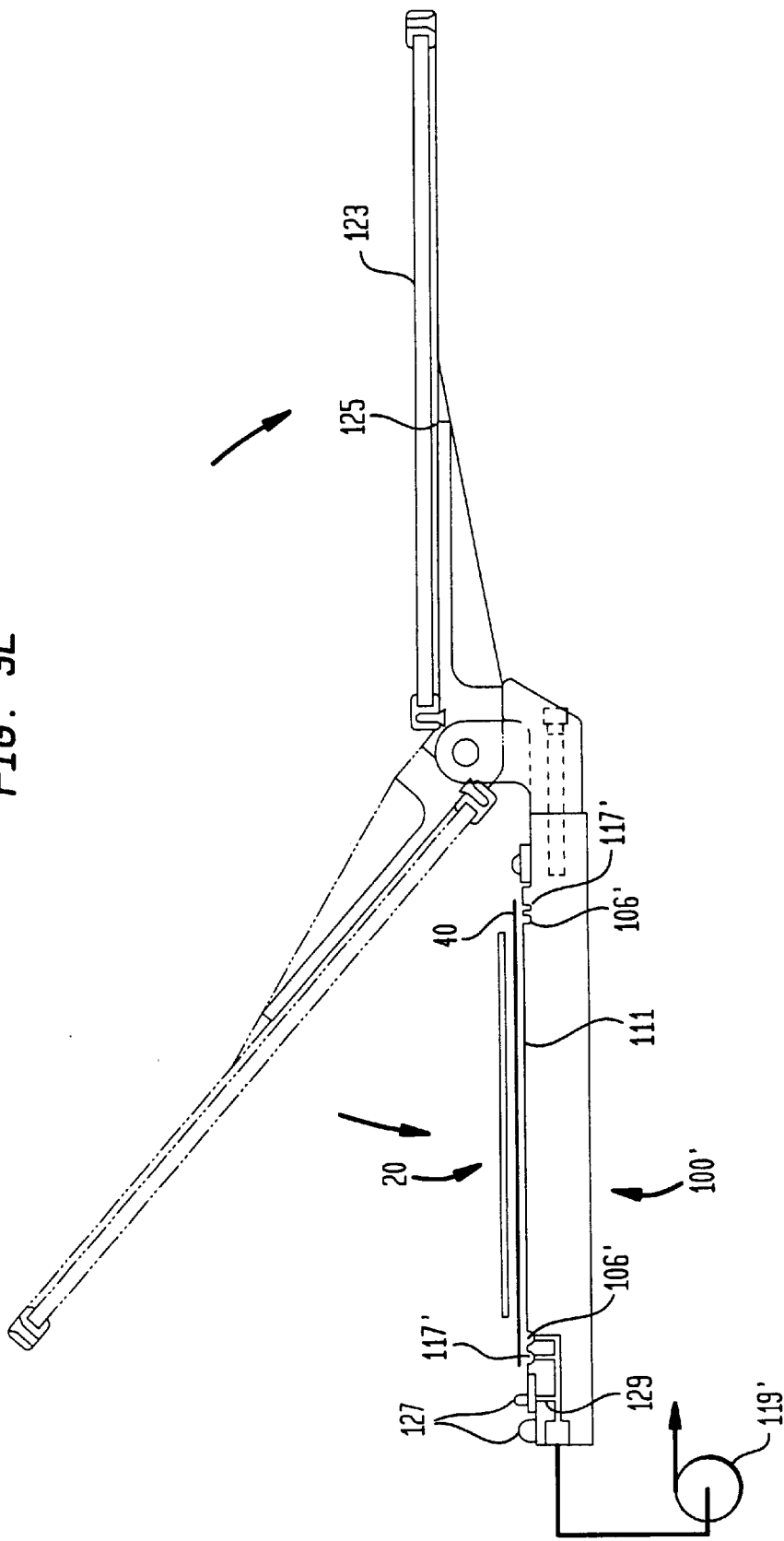
FIG. 3E is a diagrammatic elevational view of an alternate apparatus for performing the steps shown in FIGS. 3A–3D.

A variant of the frame bonding fixture shown in FIG. 3E includes a main plate 100' with a slot 117' and groove 106' in a top surface 104' for engaging and holding the sheet 40 in substantially the same manner as discussed above with reference to FIGS. 3A–3D. However, the top surface of plate 100' does not include the central recess 110 discussed above, but instead includes a smooth central region 111, preferably having a surface roughness of about 16 microinches or less, within groove 106'. When the sheet 40 is engaged with the fixture, the second or fixture-facing surface of the sheet contacts this smooth surface. This surface contact assures more uniform heating of the sheet.

The fixture of FIG. 3E further includes a clamping plate 123 mounted to main plate 100' for movement between an open position depicted in solid lines and a closed position in which the clamping plate overlies the top surface of the main plate. The clamping plate is shown in broken lines at an intermediate position 123'. The clamping plate includes a transparent element 125 formed from glass or other material transparent to light in the curing wavelength band. The clamping plate includes a device for holding the frame 20 in temporary engagement on the clamping plate, such as vacuum passages 131 which can be connected to a source of vacuum so that atmospheric pressure will hold the frame 20 against the plate. To facilitate vacuum holding, the frame 20 desirably has a smooth surface for engagement with the clamping plate. The clamping plate further includes locating pins 133 which hold frame 20 in a predetermined location on the clamping plate. When the clamping plate is in the closed position, the frame 20 held by the clamping plate bears on the sheet 40 and the transparent element of the curing plate overlies the frame 20. The fixture further includes a set of resilient seals 127 surrounding slot 107', seals 107 being adapted to engage clamping plate 123 when the clamping plate is in the closed position. A passageway 129 connects the vacuum source 119' to the a port at the top surface, inside seals 127. In operation, after the sheet 40 is engaged with the main plate and brought to the desired temperature, a frame 20 is placed over the taut, central region of the sheet and the clamping plate is closed. The vacuum applied through passageway 129 brings the space between the main plate and clamping plate to a controlled subatmospheric pressure, so that the clamping plate is urged downwardly against frame 20 with a controlled force, and in turn urges frame 20 downwardly with a controlled force. While the fixture is in this condition, the entire fixture is exposed to light in the curing wavelength band so that light is transmitted through the transparent member 125 of the top plate and through frame 20.

As discussed above with reference to FIGS. 2A and 2B, the adhesive which forms the bond between the frame and the sheet also forms fillets 62 at the interior edges of the frame. The controlled, predictable force urging the frame 20 against the sheet 40 provided by the fixture of FIG. 3E helps to provide fillets of predictable, repeatable configuration. To provide such well-controlled fillets, the adhesive should be applied to the frame 20 or sheet 40 in a repeatable manner as, for example, using a mechanized dispenser adapted to apply a bead of controlled size. The use of light to cure the adhesive also helps to provide well-controlled fillets, because the curing operation can be completed rapidly, while the parts are held together by the controlled force. Devices for applying a controlled force to the fixture plates other than the vacuum arrangement discussed above can be employed. For example, springs, weights, magnetic devices, electrical actuators and hydraulic or pneumatic actuators such as cylinders or bellows driven by controllable pressure sources can be employed.

When the assembly is cooled to room temperature, sheet 40 is held under tension by frame 20. The degree of tension is directly related to the temperature at which the sheet is bonded to the frame and the amount by which the coefficient of thermal expansion of the sheet exceeds that of the frame. Although almost any degree of tension in the sheet will make dimensional changes in the sheet more predictable than dimensional changes in a comparable unframed sheet, this effect is not enhanced by increasing the degree of tension without limit. For any particular combination of frame and sheet, there is an optimum bonding temperature which provides the most predictable dimensional changes and, typically, the smallest dimensional changes in the sheet during storage and processing. For example, using borosilicate glass and quartz frames defining a square aperture about 10 cm on a side, and using a sheet including a 50 $\mu$m polyimide layer with 5 $\mu$m of copper on each side, an initial tension of about 17–19 Newtons/cm, measured promptly after cooling to room temperature, provides good results. For this particular system, this level of tension is achieved at bonding temperatures of about 80–120° C.

In alternative framed sheet assembly processes, the frame and the sheet are both at a relatively low bonding temperature below the temperatures encountered in processing when the bonding operation is performed, and the frame has a higher coefficient of expansion than the sheet. Here again, the change in temperature from bonding temperature to the processing temperature will cause the sheet to stretch. In other processes, the sheet may be at an elevated temperature whereas the frame may be at a substantially lower temperature than the sheet during the bonding operation. In this case, contraction of the sheet upon cooling will cause the sheet to stretch even if the coefficient of expansion of the frame is greater than that of the sheet. In an alternate arrangement, the bonding step may be performed while the frame is at a bonding temperature lower than the temperature which will be employed in subsequent processing of the framed sheet, and while the sheet is at a higher temperature than the frame. Expansion of the frame will cause the sheet to stretch.

Framed sheets as discussed above may be processed through a series of steps. Typically, in some or all of the steps, the framed sheet must be aligned with an external element other than the framed sheet itself. For example, in a photographic patterning operation, such as developing photoresist, the sheet may need to be registered with a source or sources of patternwise illumination, at a preprocessing station such as the sources 200 and 202 schematically depicted in FIG. 1. A source of patternwise illumination may include elements such as a lamp or laser and a mask 206 having openings corresponding to a pattern of areas to be exposed to the light, or else may include a lamp or laser and a device such as mirrors or prisms for scanning the beam from the lamp or laser in a preselected pattern. Devices of these types are wellknown in the circuit fabrication art. In the arrangement illustrated in FIG. 1, the two patternwise illumination devices 200 and 202 are mounted to a common base 204 at the processing station so that the devices will direct patternwise illumination onto the framed sheet from opposite sides thereof.

Masks 206 may be arranged to closely overlie the sheet being traded. These masks are mounted in position relative to the base 204 of the treatment station. The masks 206 of both patternwise illumination devices 200 and 202 are mounted on the same frame 204 so that they can be maintained in precise registration with one another. Thus, features formed by the patternwise illumination on opposite sides of a work base will be in precise registration with one another. Likewise, when scanning devices are used to direct a beam onto both sides of the sheet in a pattern, both scanning devices can be mounted to the same base for precise registration. Other processing equipment which must be registered with the features on the sheet, such as mechanical punches, dies, and ablation devices, can be arranged in similar fashion, with elements adapted to treat opposite sides of the sheet mounted to a common base.

At the stage of processing illustrated in FIG. 1B, the framed sheet or article has circuit features 53 formed in previous stages of treatment of the circuit features present on one or both sides of the sheet. The patternwise illumination provided by sources 202 through masks 206 must be applied in registration with the existing features 53 on the sheet in order to form the additional features in the desired spatial relationship with the existing features. To accomplish this, the framed sheet is registered with the patternwise illumination devices by registering the framed sheet with the base 204 of the processing station. Fiducial markers 210 may be provided on the frame 20 of the frame sheet. These fiducial markers may be a permanent part of the frame itself. A robotic vision and alignment system 208 detects the position of the framed sheet and moves the frame 20 of the framed sheet into the desired alignment with the base 204 of the processing station. The robotic vision and alignment system may include appropriate actuators (not shown) for engaging and moving frame 20. Because the flexible sheet has predictable, stable dimensional properties while it is constrained by frame 20, all of the preexisting features 53 on the entire expanse of flexible sheet 40 can be accurately located relative to the patternwise illumination systems by locating the fiducial markers 210 of the frame in a known, accurate position relative to the patternwise illumination devices, as by positioning the fiducial markers in a known relationship to the base 204 of the processing station. In a variant of the approach fiducial markers 210 are replaced or supplemented by physical features such as notches 216 on the frame, or by the edges of the frame itself. Locating pins 220 may be provided at precise locations relative to base 204 and these locating pins may be engaged with features such as notches 216 or the edges of the frame.

Figure 5:
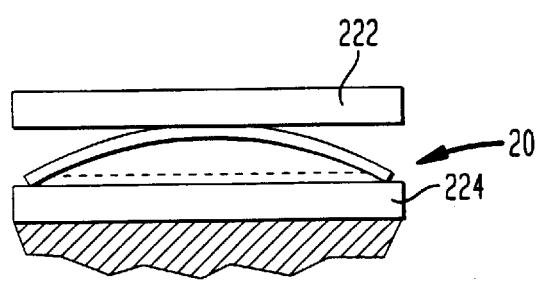
FIG. 5 is a diagrammatic elevational view of the apparatus shown in FIG. 4.

Registration accuracy can be enhanced by assuring that the frame is held in a flat condition at every processing station where precise alignment with external elements, other than the framed sheet, is required. Thus, a frame 20 can distort out of planarity as depicted in FIGS. 5 in solid lines. The processing station can be provided with a pair of platens 222 and 224 and with actuators 226 for forcing the platens toward one another so as to clamp the frame 20 therebetween. One of the platens may be mounted to the base 204 of the processing station. Where both sides of the framed sheet are to be treated, both platens should have apertures 228 and 230 which are slightly larger than the aperture 22 of frame 20. This provides access to the sheet 40 while the framed sheet is engaged between the platens.

Figure 4:
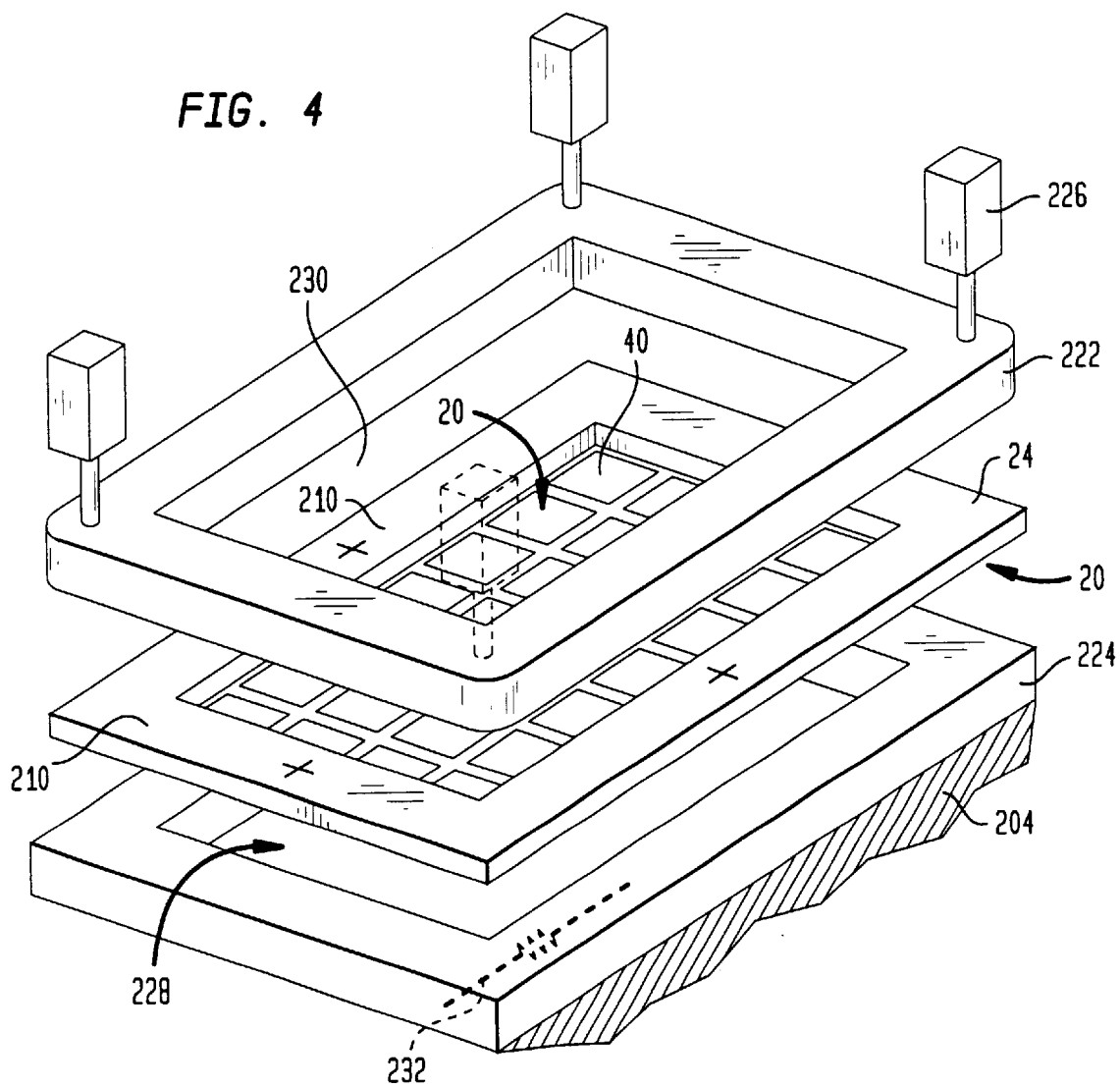
FIG. 4 is a diagrammatic perspective view of apparatus in accordance with a further aspect of the invention.

The temperature of the framed sheet can be adjusted to control the tension in sheet 40. As the temperature of the framed sheet varies, the distances between features on the sheet will also vary in a predictable manner. Provided that the sheet remains under tension and provided that the frame is substantially stronger than the sheet, the thermal expansion and contraction of the frame will control expansion and contraction of the sheet. Distances between features on the sheet will vary proportionally with distances between features on the frame. Stated another way, the thermal expansion of the sheet is determined and controlled by the frame. For example, if the framed sheet is heated uniformly, the apparent coefficient of thermal expansion of the sheet is substantially equal to the coefficient of thermal expansion of the frame. Therefore, distances between features on the sheet can be matched to distances between features of external processing apparatus such as the distances between apertures on the masks 206 of patternwise illumination apparatus (FIG. 1) by heating or cooling the frame. Where the processing station is provided with flattening platens shown in FIGS. 4 and 5, one or both of the platens can be provided with temperature control devices such as internal electric resistance coils 232 or internal heated transfer fluids circulation channels. The frame 20 of the framed sheet may be provided with similar features. Alternatively or additionally, the framed sheet can be heated and/or cooled by convection or radiation using conventional heating and cooling equipment. The process of adjusting the size of the framed sheet can be monitored by using fiducial marks 210 on the frame. Thus, robotic vision system 208 used to position the frame can also be used to monitor the size of the frame, as by monitoring the distances between fiducial marks at spaced locations on the frame. Similar effects can be achieved by adjusting the temperature of external elements to be registered with the frame sheet as, for example, by adjusting the temperature of patternwise illumination masks 206 using similar temperature control devices as discussed above.

Varying the temperature of the framed sheet will also alter the tension in the framed sheet. For example, where the coefficient of thermal expansion of frame 20 is lower than that of sheet 40, raising the temperature of the framed sheet will lower the tension in sheet 40. It is advantageous to reduce the tension in the sheet during hole-forming operations such as laser ablation, mechanical punching or chemical hole etching. Where the sheet is under very high tension and a hole is formed at one spot in the sheet, a stress concentration at the newly-formed hole can cause plastic deformation of the sheet, which in turn could impair registration accuracy during succeeding processes. Moreover, the processes used to form the holes may momentarily weaken the sheet in the vicinity of each hole while that hole is being formed. For example, where holes are formed by laser ablation or other heating processes, the heat may lower the yield strength of the sheet in areas immediately adjacent the area where a hole is being formed. All of these factors may tend to cause plastic deformation of the sheet adjacent the holes. By conducting the hole-forming process while the sheet is under a relatively low degree of tension, the possibility of such plastic deformation can be reduced. After holes have been formed at numerous locations on the sheet, the tension can be restored by cooling the framed sheet and subsequent processes can be conducted under a higher degree of tension. The size of the framed sheet, and hence the distance between features will also vary as the tension is adjusted in this manner. The external apparatus, such as hole-forming apparatus is adjusted to match the size of the sheet under the tension used in hole forming. In certain cases, the location tolerance which must be maintained during hole forming is considerably broader than the location tolerance needed in other operations. For example, as described in Published International Application WO 94/03036, the disclosure of which is hereby incorporated by reference herein, numerous leads may be arranged in rows and a hole in the shape of a large slot is formed in alignment with the row of leads to provide clearance for a bonding operation. The tolerance on placement of the slot relative to other features can be broader than the tolerance on placement of the leads themselves. Thus, even if the reduction in tension during the slot-forming operation causes some distortion of the flexible sheet, acceptable placement can be achieved.

The tension in flexible sheet 40 can be monitored by monitoring the mechanical resonant frequency of the sheet. Thus, the sheet tends to vibrate in much the same manner as a drumhead. This vibration can be excited by gently tapping the frame, or by directing sound waves through the air onto the sheet. The pitch of the resulting sound can be detected either aurally by conventional frequency-monitoring instruments connected to a conventional microphone held in proximity to the sheet. Alternatively, the amplitude of sheet vibration can be monitored optically or electronically, as by measuring changes in capacitance of the sheet relative to a fixed electrode, while varying the frequency of sound directed at the sheet. The amplitude will be greatest at the resonant frequency. The resonant frequency of the sheet will also vary with the configuration of the sheet. Thus, as the sheet is processed, and as features are formed on the sheet, the mass and the stiffness of the sheet will vary. However, for a sheet of any given configuration, there is a direct correlation between tension and resonant frequency. The framed sheets supplied to any particular processing station in a series of processing stations typically have the same configuration. Therefore, the tension in the sheet at a particular station can be specified by specifying the resonant frequency of the sheet at such station.

Figure 6:
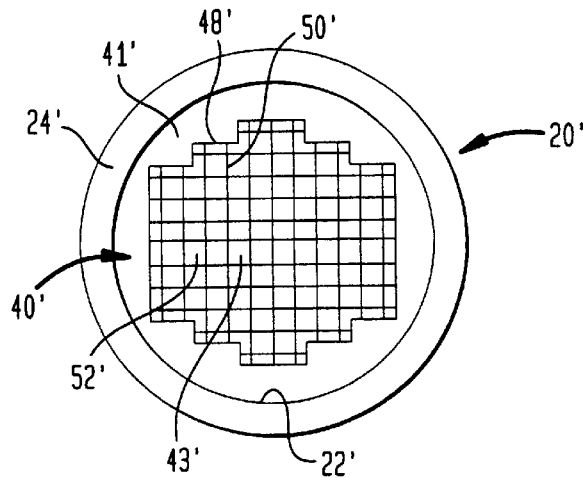
FIG. 6 is a diagrammatic top view depicting a framed sheet in accordance with a further embodiment of the invention.

A framed sheet in accordance with a further embodiment of the invention includes a frame 20' (FIG. 6) similar to the frame depicted in FIG. 1 except that the structure 24' of the frame in FIG. 6 is in the form of a unitary, circular ring. Thus, frame 20' also entirely surrounds aperture 22' and includes portions of structure 24' disposed on opposite sides of the aperture. Desirably, the cross-sectional shape of the frame is similar to that discussed above as are the other features of the frame. The sheet 40' of FIG. 6 includes an edge portion 41' adjacent frame 24. In the particular stage of processing illustrated in FIG. 6, the first metal layer within edge regions 41' is in the form of a substantially continuous, isotropic, layer of metal. This layer of metal may be an uninterrupted, single region of metal or may include a substantially continuous isotropic pattern of small metal spots. The remaining middle region 43' of the sheet is covered by a pattern of metallic elements which includes intersecting metallic strips 48' and 50' cooperatively defining numerous open areas 52' with circuit features formed within each such open area. Desirably, the elastic properties of the sheet in the edge regions are similar to those in the middle region. Most preferably, the middle region of the sheet has substantially uniform elastic properties when measured on a scale substantially larger than the size of open areas 52'.

Because the metallic layers have substantially higher modulus of elasticity than the dielectric layer, the elastic properties of the middle region of the sheet as a whole are largely determined by the elastic properties of the strips constituting the grid. Moreover, the elastic properties of the metallic elements are substantially uniform and predictable. Therefore, the elastic properties of the sheet, when measured over regions which are large in comparison with the individual open areas 52 are substantially uniform and predictable.

The features discussed above for improving the elastic properties of the flexible sheet, such as strips 48 and 50, can be applied to rectangular sheets as illustrated in FIGS. 1A and 1B, and to sheets of other shapes as well.

Figure 7:
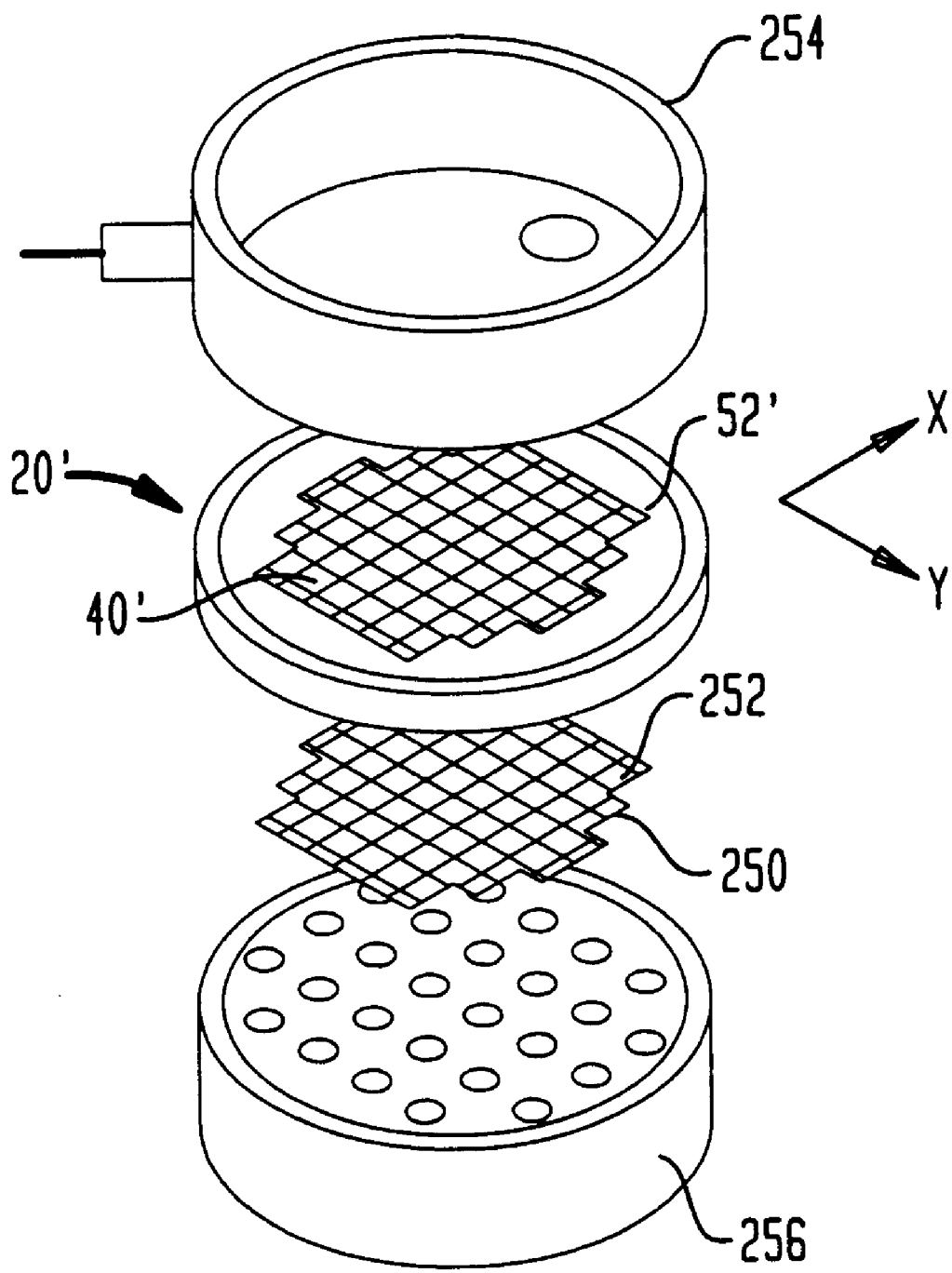
FIG. 7 is a diagrammatic perspective view depicting assembly of a framed sheet and wafer in accordance with one embodiment of the invention.

In the particular operations discussed above, the framed sheet is registered with external elements of processing apparatus. However, the framed sheet may also be registered with an external element which is a workpiece. For example, as disclosed in the aforementioned '964 patent, a framed sheet including a round frame 20' of the type illustrated in FIG. 6, may be registered with a round semiconductor wafer 250 incorporating numerous semiconductor chips 252 as depicted in FIG. 7. Thus, each of the areas 52' on sheet 40' is brought into registration with one of many chips 252. As explained in greater detail in the '964 patent, leads on the surface of sheet 40' are aligned with contacts on the surfaces of chips 252 and bonded thereto, as by application of heat and pressure. This process may employ a top platen or fixture 254 to hold and bias the framed sheet and a bottom platen or fixture 256 to hold the wafer. As also set forth in the '964 patent, after bonding the leads to the contacts on the wafer, the sheet can be moved upwardly away from the wafer so as to deform the leads through a predetermined distance, and a curable compliant material can be injected between the sheet and wafer to form a compliant layer. The sheet and the wafer are then severed to form individual units, each including one or more chips and a portion of the sheet associated with such chips. In other fabrication processes, the sheet may include leads having connection sections extending into or, preferably, across gaps in the sheet. Each lead may include a connection section having a first end permanently affixed to the sheet and a second and releasably affixed to the sheet as described, for example, in Published International Application WO 94/03036, the disclosure of which is hereby incorporated by reference herein. The gaps in the sheet may be formed in a hole-forming process as mentioned above. The leads and other features of the sheet may be formed by photolithographic processing or other processes using pattern-wise illumination to form a metallic pattern on the sheet. The sheet may be maintained in registration with a wafer while lead bonding processes taught in the '036 published application are performed.

In other cases, the sheet may be removed from frame prior to assembly with chips.

The processing operations used to form the various features on the sheet typically include exposure to one or more liquids as, for example, etching solutions, washing solutions, photoresist developers and plating solutions by immersion or spraying. Ordinarily, fluids used at one stage of the process should be removed from the framed sheet before further processing. The continuous seal between the sheet 40 and frame structure 24 formed by adhesive 60 along the edges of mounting surface 26 prevent processing fluids from entering between the sheet and the frame structure. The seal between the sheet and the remainder of the mounting surface area provides additional assurance in this regard. The fillet 62 and sloped inner edge wall 32 of the frame (FIGS. 2A and 2B) aid in the drainage of fluid from the interior of aperture 22, and facilitate drying of the sheet, such as by forced air or other flowing gas. These factors minimize the carryover of process and fluids from one processing operation to another. To avoid trapping the processing fluid in access holes 36, these holes can be plugged when no electrical contact with the sheet is required. Also, a probe used to make electrical contact with the sheet in hole 36 can be provided with a gasket or O-ring adapted to engage the frame around the periphery of hole 36 and thus exclude processing fluid from the hole when the frame and probe are immersed in a processing fluid such as an electroplating or etching bath.

Also, the inclined inner edge of the frame, the fillet and the relatively small thickness of the frame minimize the effect of the frame on mass transport to or from regions of the sheet close to the frame.

For example, the frame does not tend to cause "shadowing" or reduced etch rates in a spray etching process. Additionally, the fillets help to secure the sheet to the frame and prevent delamination of the sheet from the frame during processing.

Figure 8A:
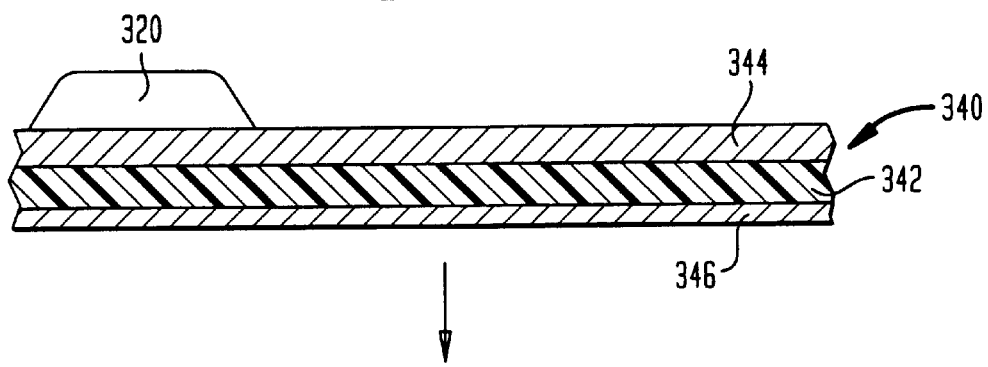
FIGS. 8A–8C are fragmentary sectional views depicting steps in a process according to a further embodiment of the invention.
Figure 8B:
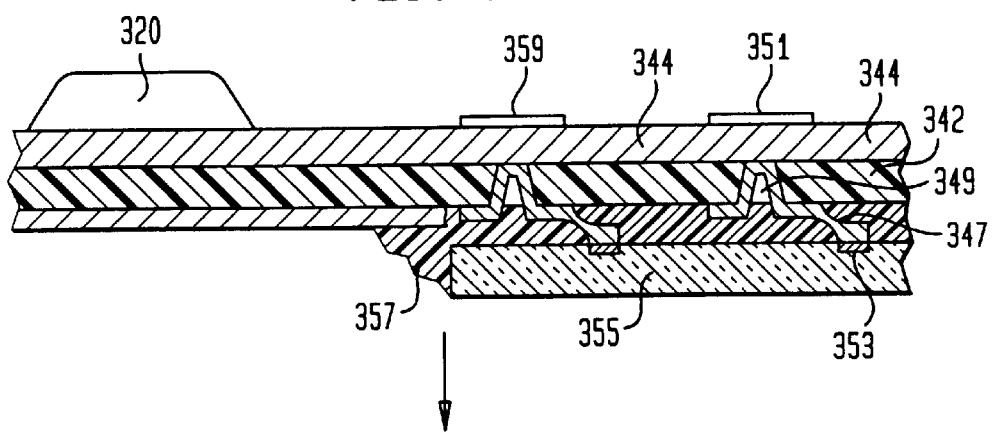
Figure 8C:
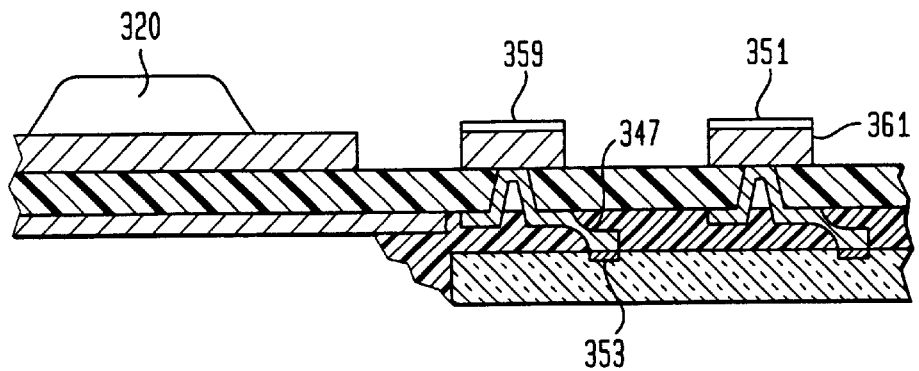

As shown in FIGS. 8A–8C, a metallic layer on the one side of the sheet may be left as a continuous or substantially continuous metallic layer during the steps of the process where the maximum precision is required. Most preferably, a continuous metallic layer on one side extends over the entire sheet and thus extends between parts of the frame structure on opposite sides of the frame aperture. Such a continuous metallic layer provides the sheet with particularly precise, isotropic physical properties during processing. The continuous metallic layer may be thicker than a metallic layer on the opposite side of the sheet. Also, the continuous metallic layer may be provided even where no metallic layer is initially provided on the opposite side of the sheet as, for example, where all the metallic features on the opposite side are built up by additive processing of the framed sheet. Even when metallic layers of substantially the same thickness are initially provided on both sides of the sheet, the continuous layer will substantially control the elastic properties of the sheet after the layer on the opposite side is etched or otherwise treated to form individual, isolated features.

After performing at least some of the processing operations on the framed sheet, the continuous layer can be entirely removed, as by etching or, preferably, can be partially removed so that the metal layer is converted to electrical terminals or other features. Thus, as shown in FIG. 8A, a framed sheet includes a frame 320 and a sheet 340 including a dielectric layer 342, a first metallic layer 344 and a second metallic layer 346 on the opposite side of the dielectric layer. First metallic layer 344 is substantially thicker than layer 346. As shown in FIG. 8B, layer 346 is selectively etched and otherwise treated to form metallic leads 347, and dielectric sheet 342 is penetrated by vias 349, which are plated to form through conductors on the walls 351 extending to the first metallic sheet 344. Leads 347 are connected to the contacts 353 of a semiconductor device such as a semiconductor wafer 355, and an encapsulant 357 is introduced between the wafer and dielectric layer 342. These steps may be performed, for example, in the manner set forth in the aforementioned U.S. Pat. No. 5,518,964 to provide flexible, compliant interconnections between the wafer and the dielectric sheet. When used with wafers having closely-spaced contacts, these steps require precise alignment of the individual leads from on the sheet with individual contacts on the wafer and thus require good dimensional stability in the sheet. After the steps have been performed, the first metal layer 344 is subdivided to form terminals in alignment with vias 359 and electrically connected to leads 357 and terminals 353 by the via liners. The subdividing step can be performed by depositing either a photoresist or an etch resistant metal 359 on the first layer in registration with vias 349. The sheet retains the maximum dimensional stability until after the spots have been deposited. After the spots have been deposited, the first layer is subdivided to form individual terminals 361, as by etching. The terminal forming step may be performed before or after subdividing the sheet and wafer to form individual units and before or after removing frame 320. The terminal forming step may be performed as taught, for example, in United States Provisional Patent Application 60/032,828 filed Dec. 13, 1996, the disclosure of which is hereby incorporated by reference herein and as taught in copending, commonly assigned U.S. patent application Ser. No. 08/366,236 filed Dec. 29, 1994, which is also incorporated by reference herein, and in copending, commonly assigned U.S. patent application Ser. No. 08/989,312, filed Dec. 12, 1997, the disclosure of which is also incorporated by reference herein.

In certain operations using framed sheets, it is desirable to treat only one side of the sheet. For example, in the process of FIGS. 8A–8C, only one of the metallic layers is treated during the early stages of the process. Also, even where terminals or other features are formed on both sides of the sheet, it may be desirable to plate or etch only one side during a particular operation or series of operations. Conventional masking techniques use a masking layer applied in contact with a surface of the sheet. Such a masking layer typically must be removed by a "wet" process such as dissolution or etching in order to expose the masked side of the sheet for subsequent processes. As shown in FIG. 9A, a sheet-like masking element 401 may be temporarily adhered to the frame structure to protect one side of the sheet. Desirably, the masking element bridges across the frame so that there is a space 425 between the masking element and the surface of flexible sheet 440. Most preferably, the masking element adheres to the frame so that it forms a fluid-tight seal around the perimeter of the frame and completely blocks entry of fluids to space 425. The masking element thus protects the adjacent side of sheet 440 from contact with fluids. However, the masking element 401 desirably can be removed from the frame by mechanically peeling it away. Preferably, the masking element should be selected to release from the frame without leaving a contaminating residue or particles on the sheet. One suitable masking material includes a relatively stiff backing together with a layer of gel. One such material is sold under the commercial designation Gel-Pak. This material is commonly used for packing individual semiconductor chips or other microelectronic devices. Because gel layer 401 can be peeled away from adhering structures without leaving a residue, the gel layer can be placed in contact with the sheet itself, rather than in contact with the frame. Other adherent form-like or plate-like structures can be used as, for example, an adhesive tape of the type commonly referred to as "plater's tape," used for masking plating frames or structures. However, where the adhesive leaves a residue, the adherent layer should engage only the frame and should not touch the sheet. As also shown in FIG. 9A, a framed sheet in accordance with the invention may include two frames having structural elements on opposite sides of the sheet. Frame 420 has a structural element 424 on one side and frame 421 has a structural element or elements 425 on the other side of the sheet. Preferably, each frame includes a closed ring-like structure, such as a rectangular or round ring as discussed above defining a gap or aperture, and each frame has structural elements on opposite sides of the aperture as, for example, parts of the same continuous ring on opposite sides of the aperture as discussed above. This arrangement provides even better dimensional control and resistance to out of plane deformation of the framed sheet. Stated another way, the two frames 420 and 421 constitute a frame assembly which acts as a composite beam or plate having a neutral plane in bending 423 extending between the frames. Because the sheet which is held in tension by the frame assembly is disposed adjacent to this neutral plane 423, the forces exerted by the sheet on the frame will produce very small or zero bending moments on the frame.

Figure 9B:
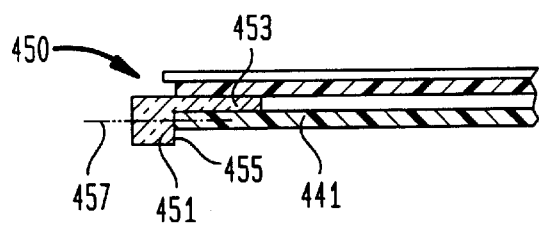
FIGS. 9A–9F are diagrammatic elevational views depicting elements in accordance with further embodiments of the invention.
Figure 9A:
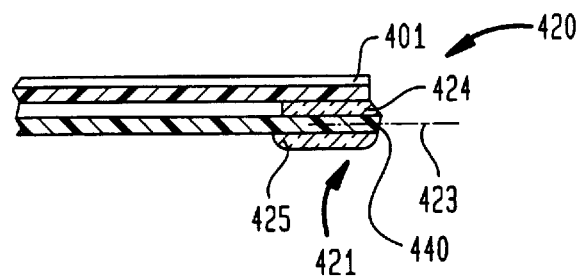

As shown in FIG. 9B, a single frame 450 may have a structural element extending on both sides of the sheet. For example, structural element 451 includes a ledge surface 453 projecting inwardly on one side of the sheet 441 and a lip or ridge 455 projecting to the other side of the sheet. Alternatively, structural element 451 can be made with a generally U-shaped cross-section with a further flange projecting inwardly, parallel to flange 453 on the opposite side of the sheet. Lip or ridge 455 projects in a vertical direction, transverse to the plane of sheet 441. Flange 455 may be provided with a fillet, such as a fillet of adhesive at its juncture with sheet 441 to facilitate drainage of processing fluids from the region enclosed by the frame. Also, the inwardly facing wall of lip 455 may be sloped outwardly, away from the sheet to further facilitate drainage, substantially in the same way as discussed above with reference to FIGS. 2A and 2B. Providing frame structure which extends on opposite sides of the sheet also facilitates the use of a masking element on either side of the sheet as required without engaging the surface of the sheet. Moreover, the sheet 441 desirably is disposed close to a neutral plane 457 of the frame in bending, i.e., a plane passing through the center of inertia of the frame rail cross-section. This minimizes any tendency of the frame to deform out of plane under the forces applied by sheet 441.

Figure 9D:
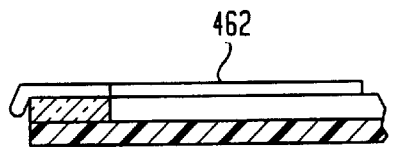
Figure 9C:
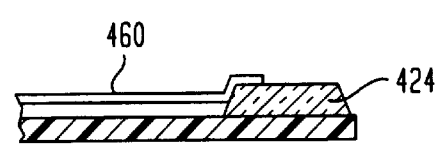

As shown in FIG. 9C, one side of a sheet can be protected by a resilient lid 460 mechanically engaged with frame structure 424 as, for example, by nesting the resilient lid in engagement with the inner edge wall of the frame. Alternatively, a lid 462 (FIG. 9D) can be engaged with the outer wall of the frame. Lids such as lids 460 and 462 may be entirely formed from a resilient material or else may be formed from a rigid material with resilient elements such as O-rings or other seals adapted to engage the frame.

Figure 9E:
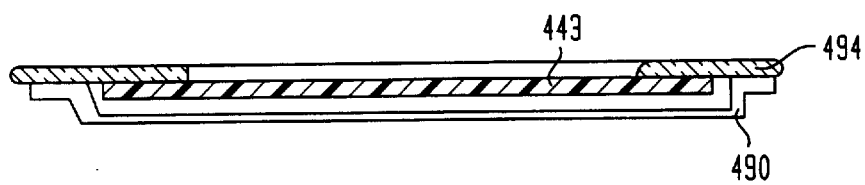

As shown in FIG. 9E, a lid 490 may be adhesively bonded to the frame. Preferably, such an adhesive bond utilizes a light-degradable adhesive as discussed above so that the bond between the lid and the frame structure element 494 may be released by exposure to the light in a degradation wavelength band. Preferably, the adhesive bond between the lid and the frame structure element is formed in a region of the frame outside the periphery of the flexible sheet 443. This arrangement may be utilized even if the frame structure element is not light transmissive, provided that the lid is light transmissive at least in the region bonded to the frame. The lid can be released from the frame without releasing the sheet from the frame by selectively directing the degradation light onto the bond between the lid and frame, without exposing the bond between the sheet and the frame to such light.

Figure 9F:
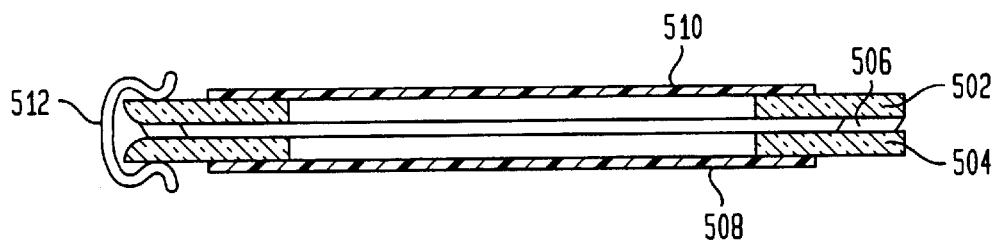

As shown in FIG. 9F, a pair of framed sheets can be mounted back-to-back with the frames 502 and 504 of the two framed sheets engaging one another and sealed to one another, as by an adhesive bond 506. Those sides of the framed sheets facing towards the interior of the assembly are protected from processing fluids, whereas the outwardly facing sides of sheets 508 and 510 are exposed for processing. Here again, adhesive bond 506 may be formed by a light-degradable adhesive. Preferably, such a bond is disposed in an area of each frame outside of the region covered by the attached sheet. Alternatively, a flexible seal such as an O-ring can be engaged between the frames and the frames can be clamped to one another, as by resilient spring clips 512, screw clamps or other conventional clamping devices.

Figure 10A:
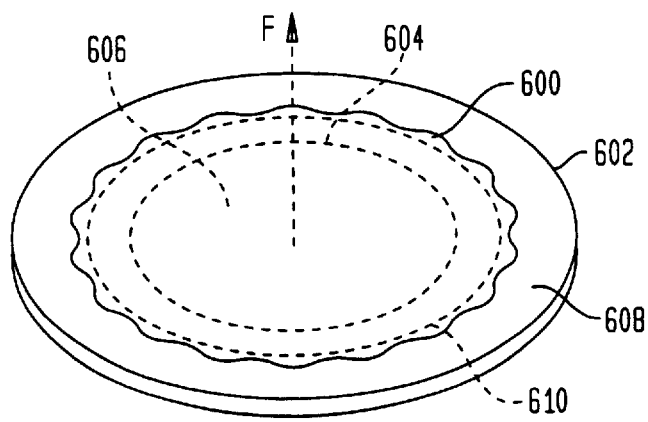
FIGS. 10A and 10B are diagrammatic perspective views showing apparatus in accordance with a further embodiment of the invention.
Figure 10B:
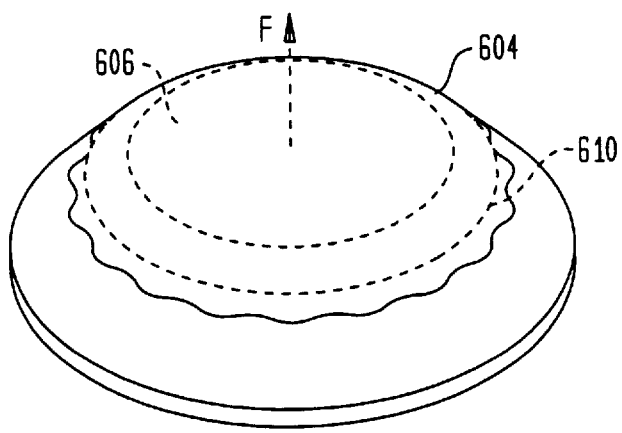

As shown in FIGS. 10A and 10B, a flexible sheet 600 can be tensioned using a generally annular fixture 602 having an inner edge 604 defining a central hole 606. The fixture also has a first surface 608 facing in a first direction F (upwardly as seen in FIG. 10A). Preferably, the annular fixture is generally in the form of a circular annulus, and inner edge 604 is in the shape of a circle. Sheet 600 is secured to the first surface 608 of the annular fixture along a line of engagement 610 encircling the inner edge 604 and hole 606. Preferably, the line of engagement is parallel to the inner edge. Thus, where the edge 604 is circular, the line of engagement 610 is a circle concentric with inner edge 604. The region of the sheet outside of the line of engagement 610 also may be secured to first surface 608, but the region inside of the line of engagement desirably is not secured to the first surface. The engagement between the sheet and the fixture may be provided by a clamping ring (not shown) having an inner edge at the line of engagement and forcibly engaged with the sheet as to hold the sheet on the fixture. Alternatively, the engagement between the sheet and the fixture can be provided by bonding the sheet to the fixture using an adhesive. Other means for securing the sheet to the fixture at and preferably outside of the line of engagement may also be employed. The sheet need not be under tension when engaged with the fixture, but desirably should be substantially free of wrinkles or creases. In the next stage of the process, the fixture is deformed to a generally frustoconical shape as shown in FIG. 10B. In this deformation, inner edge 604 moves in the first direction relative to the line of engagement 610. This causes a central region of the sheet overlying hole 606 to stretch taut. The deformation of the annular structure can be produced in several ways. The annular structure may be a large, spring-like washer arranged to deform to the frustoconical shape under the influence of its own resilience. The annular fixture may be held in a flattened or partially flattened condition during the first stage of the process, when the sheet is secured to the fixture. Alternatively, the fixture can be forcibly deformed into a conical shape by engaging it between a punch and die, preferably in the area outside of the area covered by the sheet. In yet another embodiment, the annular fixture may be a bimetallic structure or a shape-memory alloy structure so that the fixture tends to lie flat at a first temperature and to deform into the frustoconical shape at a second, different temperature.

After the fixture has been deformed to the frustoconical shape and the sheet has been stretched, the sheet may be bonded to a frame as discussed above. Alternatively, the frustoconical fixture may itself serve as a frame for further processing of the sheet.

Figure 11:
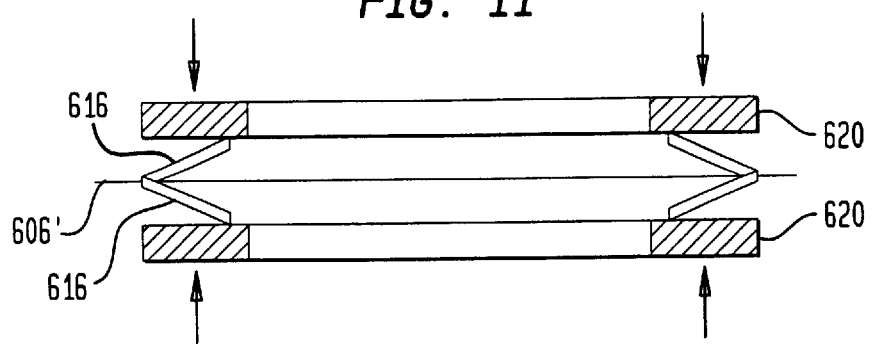
FIG. 11 is a diagrammatic elevational view showing apparatus in accordance with yet another embodiment of the invention.

In a further tensioning method, a sheet 606' may be engaged between a pair of generally frustoconical washers 616 of the type commonly referred to as Bellville washers. The larger end of each washer is abetted with the sheet, so that the washers are positioned generally back-to-back on opposite sides of the sheet as shown in FIG. 11. The washers are then squeezed between a pair of opposing platens 620, causing the large ends of the washers to grip the sheet tightly from opposite sides so that the sheet is firmly engaged between the washers. As the platens move towards one another, the large ends of the washers tend to expand radially outwardly, thereby stretching a central region of the sheet within the area encircled by the washers. Here again, while the sheet is held under tension, it may be bonded to a frame as discussed above.

The ends of the washers which engage the sheet desirably are free of sharp edges. The edges may be covered with a soft, conformal coating such as rubber to avoid damaging the sheet. Washers 616 need not be formed from metal, but instead may be formed from a polymer or other resilient material. Also, washers 616 need not be circular cones. They may be generally pyramidal, so that each washer engages the sheet along a rectangular line. The corner regions of such pyramidal washers may be cut away or folded to permit free movement of the generally straight sections of the washers between the corners. This will be applied as axial tension to the sheet.

Figure 12A:
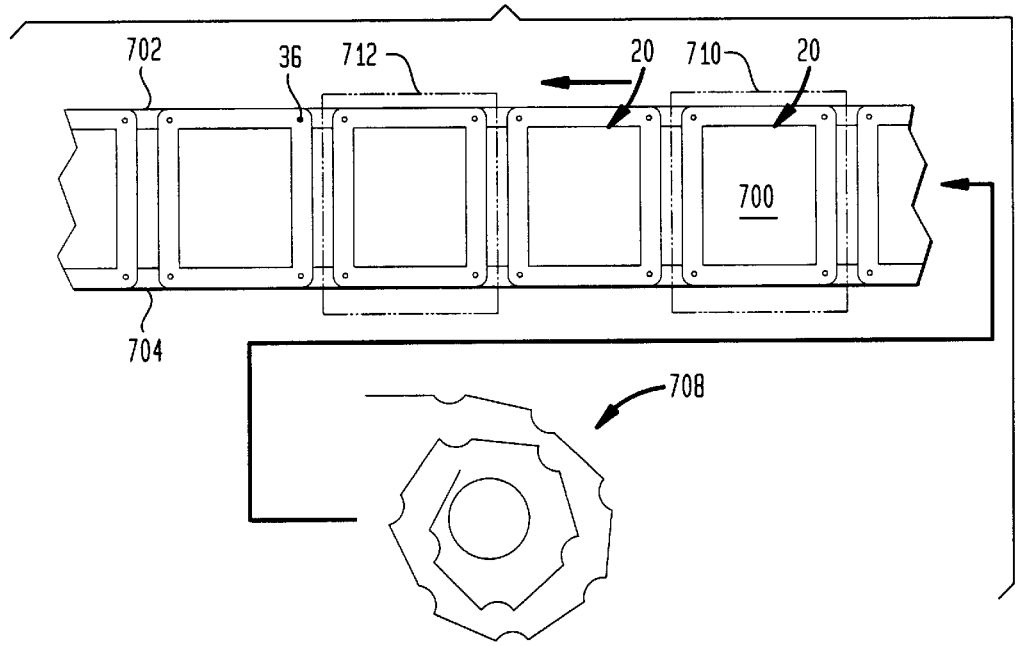
FIG. 12A is a diagrammatic top view depicting a strip of framed sheets in accordance with a further embodiment of the invention in conjunction with processing apparatus.
Figure 12B:
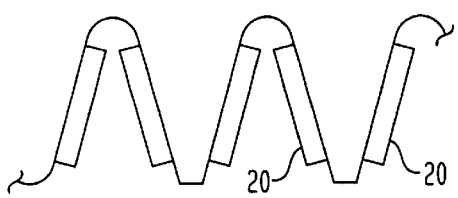
FIGS. 12B and 12C are diagrammatic side views depicting framed sheets in accordance with still further embodiments of the invention.
Figure 12C:
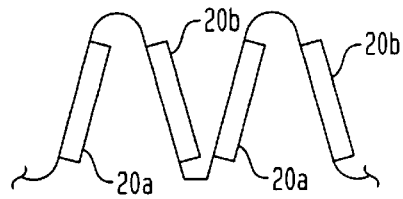

As depicted in FIG. 12, framed sheets in accordance with the invention may be provided as parts of an elongated strip such as a semicontinuous strip of the flexible sheet material. Thus, a plurality of frames 20 are mounted to a strip of sheet materials at spaced apart locations along the strip so that each frame encloses a separate central region 700 of the strip. Where the frames are generally rectangular, one pair with both sides generally rides along the edges of the strip. Desirably, the contact openings 36, discussed above with reference to FIGS. 1 and 2B lie in border or selvage regions adjacent opposite edges 702 and 704 of the strip. When a strip of sheet material is formed, the border or selvage regions at the edges typically are of lower quality than the central regions remote from the edges, but still are of sufficient quality to allow attachment of the frame and to allow electrical contact with the metal layers. A continuous strip of sheet material with frames thereon can be wound into a roll 708 for storage and handling. Such an elongated strip can also be advanced through a series of processing stations, such as the representative processing stations 710 and 712, by feeding the strip lengthwise, so that the strip moves in a downstream direction parallel to the length of the strip. Typically, the feeding operation is performed so that the strip moves intermittently and halts at each processing station. Although the frames are present on the strip, the strip can still be handled and moved by techniques similar to those with web-like materials. Such handling techniques are commonly referred to as "reel-to-reel" processing techniques. As shown in FIG. 12B, the strip bearing frames 20 can be folded in rather than wound on a roll. In the folding pattern of FIG. 12B, all of the frames are mounted on one surface of the strip, so that the frames will abut one another, and regions of the strip on the other surface will abut one another. As seen in FIG. 12C, alternate frames 20*a* and 20*b* can be placed on opposite surfaces of the strip, so that each frame engages a surface of the strip when the strip is folded. In a further variant, dual frames aligned with one another on opposite surface of the sheet as discussed with reference to FIG. 9A can be provided on a strip, so that the frames abut one another when the strip is folded.

The sheet-like material used in preferred embodiments of the present invention commonly are supplied in roll form. However, handling and storing sheet-like materials in a roll can induce nonuniform tension in different areas of the sheet. Although the present invention is not limited by any theory of operation, it is believed that this arises from a nonuniform tension applied during winding of the roll and from effects such as the weight of the roll itself bearing on parts of the sheet during storage. Such nonuniform tension can cause nonuniform dimensional changes when the sheet-like material is unrolled and processed.

Figure 13:
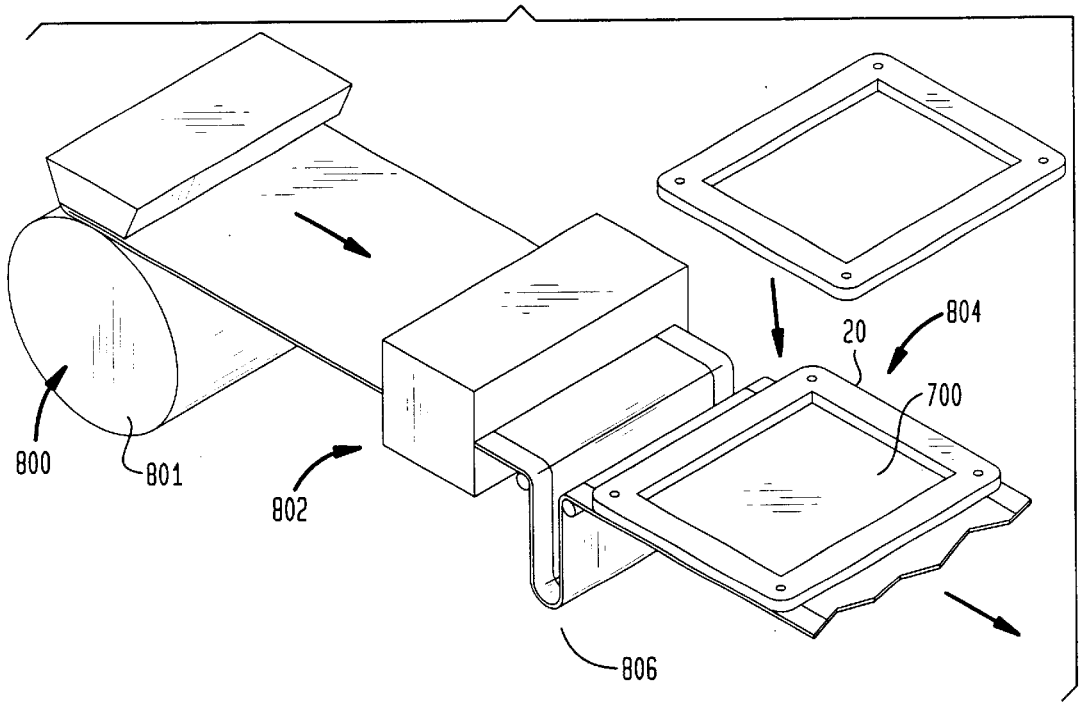
FIG. 13 is a diagrammatic perspective view depicting certain steps in a framed sheet fabrication process in accordance with yet another embodiment of the invention.

The defects may be avoided by applying the frames to the sheet when the sheet is formed. As depicted schematically in FIG. 13, the sheet-like material is commonly formed by a continuous casting process 800 such as casting a polymeric material onto a belt or, preferably onto a roller 801, followed by a continuous metallization process such as electroless plating, electroplating, sputtering or vacuum metallization. Preferably, the metallization process is conducted immediately after the material is formed, so that the sheet material need not be stored in roll form between these processes. The framed sheets can be formed immediately after the metallization process, as by feeding the sheet downstream to a frame applying process station 804 incorporating the tensioning and frame bonding steps discussed above for the motion of the sheet and the frame applying station 804 may be intermittent, whereas the motion of the sheet in the other process steps may be continuous. An accumulating loop or other buffer station may be provided between the continuous process stations and the intermittent frame applying stations to allow momentary accumulation of the sheet while the downstream portion of the sheet is halted at the frame applying station. By tensioning and framing each portion of the strip as the same is formed, the strip can be tensioned and framed before it is ever stored in roll form. Thus, each central region 700 of the strip is tensioned and bonded to a frame 20 before such central region can ever contact another portion of the strip. Also, by applying a succession of frames to successive portions of the strip, a continuous strip of frames such as discussed above with reference to FIG. 12 can be formed. Once the central regions have been engaged with the frames, storage and handling of the strip in roll form has essentially no influence on the tension within each central region. In a variant of this process, the frame applying step is performed before metallization. Thus, immediately after each portion of the strip is cast, the same is tensioned and engaged with a frame. Metallization, if desired, can be performed by feeding the strip through the metallization process with the frames thereon or else can be performed after separating the strip into individual framed sheets.

Figure 14:
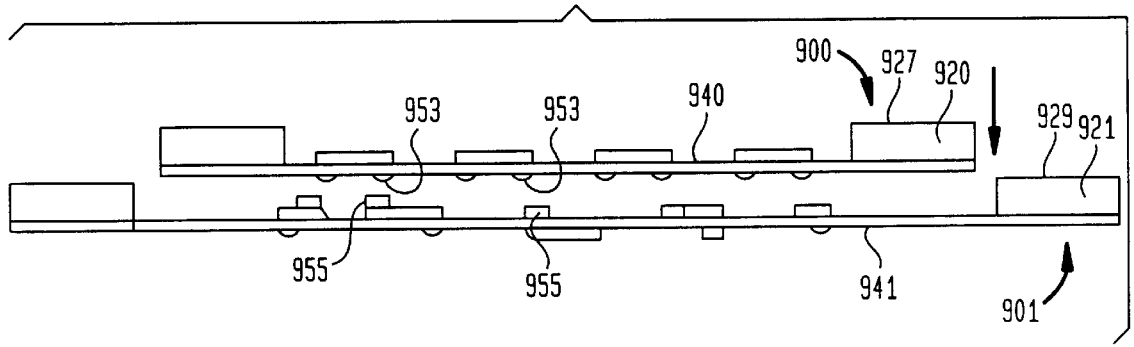
FIG. 14 is a diagrammatic sectional view depicting a process in accordance with a further embodiment of the invention.

In a process according to a further embodiment of the invention, a framed sheet can be assembled to a further framed sheet to form a composite assembly such as a multilayer circuit panel. As shown in FIG. 14, two framed sheets 900 and 901 are provided. Framed sheet 900 includes a frame 920 holding a flexible sheet 940 taut. At the stage of processing shown, sheet 940 has electrically conductive features 953 disposed at preselected locations on a surface of the sheet. Similarly, framed sheet 901 includes a frame 921 holding a taut sheet 941 with features 955 thereon. Most preferably, the features 953 and 955 have been formed on sheets 940 and 941 while the sheets were held in the frames, using processes as discussed above, so that the features on each sheet are formed in precise locations relative to one another and relative to the frame associated with such sheet. In the process stage illustrated in FIG. 14, the framed sheets are registered with one another and stacked so as to superpose the flexible sheets 940 and 941 and bring features 953 and 955 into contact with one another. In this process, each framed sheet acts as an external element to be registered with the other framed sheet. Thus, the features on the sheets can be brought into registration with one another by registering fiducial marks 927 and 929 on the frames with the base of a processing station using robot vision or mechanical means as discussed above. The aligned features 953 and 955 can be bonded to one another, as by bonding material carried on these features. Alternatively or additionally, bonding material can be provided on additional sheets (not shown) which may also be provided as framed sheets. Methods of forming multilayer circuits by bonding a plurality of sheet-like circuit panels to one another are taught in U.S. Pat. No. 5,282,312, the disclosure of which is hereby incorporated by reference herein. A multilayer circuit formed from a plurality of framed sheets may be combined with a wafer or other assembly of chips in the same manner as discussed above, and such an assembly can be severed to form individual units each including one or more chips and a part of the multilayer circuit. Alternatively, the bonded circuit panels may be removed from the frames and assembled to chips or other components in a separate operation.

Figure 15:
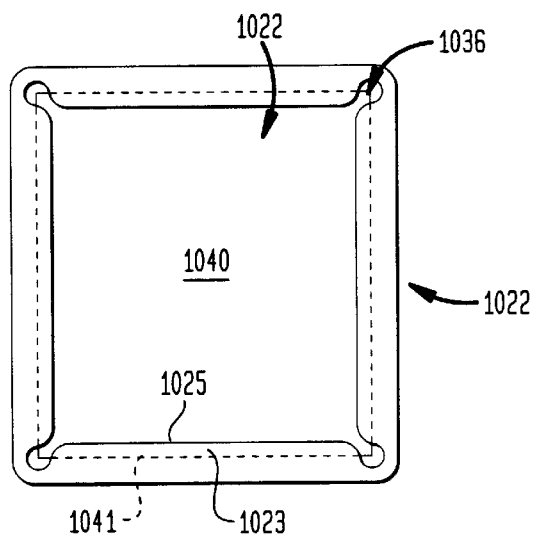
FIG. 15 is a diagrammatic plan view depicting a framed sheet in accordance with yet another embodiment of the invention.

The framed sheet of FIG. 15 includes a rectangular frame 1022 defining openings 1036 in the form of slots having open ends which merge with the central aperture 1022 of the frame. In this embodiment as well, the sheet 1040 extends across the central aperture. The sheet overlies inboard regions 1023 of the frame surface, between the edge 1041 of the sheet and the inner edge 1025 of the frame. In this embodiment, the inner edge 1025 of the frame is not continuous. However, the frame still provides substantially uniform, biaxial tension in that portion of the sheet remote from the corners. The discontinuities tend to relieve local nonuniformities in stress at the corners. Openings 1036 also can be used as contact openings. Those portions of the sheet exposed within openings 1036 remote from the inner edges 1025 of the frame are mechanically isolated from the main portion of the sheet in aperture 1022 by the frame. Electrical contacts can engage a metallic layer on the surface of the sheet in such remote portions without disturbing the uniform tension in the main portion.

The frame 1120 of FIG. 16 illustrates several variations in the design of frames. The inner edge 1125 of the frame bounding the central aperture 1122 is generally hexagonal, rather than rectangular or circular. Other regular and non-regular polygonal shapes can be employed as well, and indeed arbitrary shapes may be used. The outer edge 1127 of the frame is not parallel to the inner edge; the outer edge may have any shape. The frame does not entirely surround the central aperture 1122, but instead has a slot 1123 extending entirely across the frame. The slot is relatively small, so that the frame still substantially surrounds the central aperture and still provides uniform tension in the sheet, at least at locations remote from the slot. Slot 1123 may serve as a contact opening. The frame has further contact openings 1136 in the form of slots extending partially across the frame rail, and additional contact openings 1137 in the form of elongated holes extending through the frame rail. Here again, the holes and slots extend inboard of the outer edge 1141 of the sheet so that the sheet is exposed in the holes and slots. An electrical contact can be engaged with a metallic layer on the sheet in the contact openings without disturbing the main portion of the sheet in aperture 1122. The relatively large size of holes 1137 allows engagement of a large contact so as to provide a low current density at the interface with the metallic layer of the sheet.

In a further variant, frames may be formed in place on one or both surfaces of the sheet, desirably while the sheet is held in tension. For example, frames may be formed by depositing metal, as by sputtering or electroless plating, preferably followed by electroplating. The electroplated deposit may merge with a preexisting metallic ring or frame to form a composite ring or frame. Also, frames may be formed by casting or molding a material on one or both sides of the sheet, as by clasping the sheet in a mold and injecting the material in flowable form so that the material solidifies in contact with the sheet. For example, a polymeric frame may be formed by reaction curing a polymer in contact with the sheet, whereas a metallic frame may be formed by injecting the metal in a molting state into a mold while the sheet is disposed in the mold. A process of injecting metal and curing the same in contact with a nonmetallic element is commonly referred to as assembly die casting.

In still further variants, the external elements used with the framed sheet may include one or more individual semiconductor chips, which can be attached to the framed sheet simultaneously or individually as taught in the aforementioned U.S. Pat. No. 5,798,286. In yet another variant, the frame may be used as a fixture for encapsulation of the assembly. Processes for encapsulation of an assembly using a frame to constrain the encapsulant are taught in certain embodiments of U.S. Pat. No. 5,776,796 and in copending, commonly assigned U.S. patent application Ser. No. 09/067,698 filed Apr. 28, 1998, the disclosures of which are hereby incorporated by reference herein. In still further variants, the sheet can be removed from the frame after processing and assembled to chips or other elements in the same manner as a conventional sheet.

In the preferred embodiments discussed above, light is used to degrade the adhesive holding the sheet to the frame. However, this is not essential in all embodiments of the invention. For example, the sheet can be freed from the frame by cutting the sheet along the inner edge of the frame. Depending on the economics of the process, it may be advantageous to discard the frame, without ever breaking the bond between the frame and the remaining portions of the sheet. In other cases, the bond can be broken by physically peeling the sheet away from the frame. The frame can be exposed to a chemical solvent which attacks the adhesive, either before or after removing the sheet. For example, the aforementioned Loctite 363 vv-curable adhesive can be removed using a mixture of N-methyl pyrolidone (also known as "NMP") and ethanolamine such as that sold under the commercial designation Cherokee EPR Stripper. Other debonding solvents that may be used include NMP with a surfactant, sodium hydroxide and potassium hydroxide. In other cases, the useful portions of the sheet can be removed physically, whereupon the adhesive and any remaining portions of the sheet can be degraded by exposing the frame to high temperatures. The most preferred frame materials, such as quartz and glass, have excellent resistance to chemical solvents and high temperatures, and can withstand many repetitions of these procedures.

As these and other variations and combinations of the features set forth above can be used, the foregoing description of the preferred embodiments should be taken as illustrating, rather than as limiting, the scope of the invention as defined by the claims.

What is claimed is:

1. A method of processing a flexible sheet comprising the steps of:
    (a) providing a frame having an aperture and a light-transmissive portion extending adjacent the aperture;
    (b) temporarily holding the flexible sheet taut so that the sheet extends across the aperture and overlies the light-transmissive portion of the frame;
    (c) providing an adhesive between the sheet and the light transmissive portion of the frame so that the adhesive contacts the frame and the sheet; and
    (d) during said temporary holding step, bonding the sheet to the frame so that the frame holds the sheet taut by directing light in a curing wavelength band through the light-transmissive portion of the frame to cure the adhesive.

2. A method as claimed in claim 1, further comprising the step of performing at least one operation on said sheet while said sheet is bonded to the frame.

3. A method as claimed in claim 1 wherein said curing wavelength band is in the ultraviolet wavelength band.

4. A method as claimed in claim 1 wherein said bonding step is performed while said sheet and said frame are at an elevated temperature.

5. A method as claimed in claim 4 wherein said frame has a coefficient of thermal expansion different than the coefficient of thermal expansion of said sheet.

6. A method as claimed in claim 1 wherein said bonding step includes urging said frame and said sheet towards one another with a compressive force so that a portion of said adhesive is squeezed to one or more edges of said frame and forms fillets at such edges.

7. A method as claimed in claim 6, further comprising the step of controlling said compressive force.

8. A method of processing a framed sheet for forming microelectronic components comprising the steps of:
    (a) providing a framed sheet including (i) a frame having an aperture and a light-transmissive portion, and (ii) a flexible sheet extending across the aperture and bonded to the light transmissive portion of the frame;
    (b) performing at least one operation on features of said flexible sheet which will be included in the microelectronic component; and
    (c) releasing the bond between said sheet and said frame after performing said at least one operation by directing light in a degradation wavelength band through the transmissive portion of the frame to the bond.

9. A method as claimed in claim 8, further comprising the step of reusing the frame after said releasing step by uniting the frame with a new flexible sheet to form a further framed sheet.

* * * * *